US009019677B2

(12) United States Patent
Kikuchi

(10) Patent No.: US 9,019,677 B2
(45) Date of Patent: Apr. 28, 2015

(54) SEMICONDUCTOR SWITCHING ELEMENT DRIVE CIRCUIT

(75) Inventor: Yoshiyuki Kikuchi, Saitama (JP)

(73) Assignee: Calsonic Kansei Corporation, Saitama-ken (JP)

(\*) Notice: Subject to any disclaimer, the term of this patent is extended or adjusted under 35 U.S.C. 154(b) by 0 days.

(21) Appl. No.: 14/111,215

(22) PCT Filed: Apr. 5, 2012

(86) PCT No.: PCT/JP2012/059381
§ 371 (c)(1),
(2), (4) Date: Oct. 25, 2013

(87) PCT Pub. No.: WO2012/147489
PCT Pub. Date: Nov. 1, 2012

(65) Prior Publication Data
US 2014/0049867 A1    Feb. 20, 2014

(30) Foreign Application Priority Data
Apr. 27, 2011    (JP) .................................. 2011-099759

(51) Int. Cl.
*H02H 9/02* (2006.01)
*H03K 17/082* (2006.01)

(52) U.S. Cl.
CPC .......... *H02H 9/025* (2013.01); *H03K 17/0828* (2013.01)

(58) Field of Classification Search
CPC .......................... H02H 9/025; H03K 17/0828
USPC ...................................................... 361/93.9
See application file for complete search history.

(56) References Cited

U.S. PATENT DOCUMENTS

| 5,375,029 A | * | 12/1994 | Fukunaga et al. | ............ 361/101 |
| 5,396,117 A | * | 3/1995 | Housen et al. | ................ 327/480 |

(Continued)

FOREIGN PATENT DOCUMENTS

| DE | 44 10 978 | 10/1994 |
| DE | 196 30 697 | 2/1998 |

(Continued)

OTHER PUBLICATIONS

International Search Report issued May 22, 2012 in International (PCT) Application No. PCT/JP2012/059381.

(Continued)

*Primary Examiner* — Scott Bauer
(74) *Attorney, Agent, or Firm* — Wenderoth, Lind & Ponack, L.L.P.

(57) ABSTRACT

A semiconductor switching element drive circuit includes a semiconductor that passes main current between first and second terminals when voltage is imposed to a gate terminal, and an over current protection circuit that decreases the main current when the main current is judged to become over current for a certain period when exceeding a predetermined current value when current value or voltage value proportional to an amplitude of the main current exceeds a threshold value. The circuit also includes a short circuit protection circuit that decreases gate voltage imposed to the gate terminal earlier than a fall of the main current produced by the over current protection circuit when the main current becomes larger than the over current in a period shorter than the certain period, and a threshold value change circuit that decreases a threshold value when the short circuit protection circuit decreases the main current.

12 Claims, 19 Drawing Sheets

(56) References Cited

U.S. PATENT DOCUMENTS

| | | | |
|---|---|---|---|
| 5,444,591 A | 8/1995 | Chokhawala et al. | |
| 5,559,656 A | 9/1996 | Chokhawala | |
| 5,710,508 A * | 1/1998 | Watanabe | 323/284 |
| 6,057,728 A * | 5/2000 | Igarashi | 327/546 |
| 6,680,835 B2 * | 1/2004 | Tabata | 361/79 |
| 6,891,707 B2 * | 5/2005 | Hiyama et al. | 361/93.1 |
| 7,242,238 B2 * | 7/2007 | Higashi | 327/427 |
| 7,957,115 B2 * | 6/2011 | Higashi | 361/93.7 |
| 2001/0026429 A1 | 10/2001 | Fukuda et al. | |
| 2011/0304941 A1 * | 12/2011 | Tanimura et al. | 361/93.9 |

FOREIGN PATENT DOCUMENTS

| | | |
|---|---|---|
| JP | 5-275999 | 10/1993 |
| JP | 8-316808 | 11/1996 |
| JP | 2001-345688 | 12/2001 |
| JP | 4356248 | 11/2009 |

OTHER PUBLICATIONS

Extended European Search Report issued Sep. 26, 2014 in European Patent Application No. 12777091.5.

* cited by examiner

SEMICONDUCTOR SWITCHING ELEMENT DRIVE CIRCUIT

TECHNICAL FIELD

The present invention relates to a semiconductor switching element drive circuit that is capable of preventing a semiconductor switching element from breakdown in a case where over current runs through the terminals of the element or in a case where a load such as an electric motor becomes to be in a short circuit state while the element is driven.

BACKGROUND OF THE INVENTION

A conventional semiconductor switching element drive circuit is known in the Patent document 1 shown below. This conventional semiconductor switching element drive device includes a semiconductor switching element, an over current protection circuit, and an over current restriction circuit (a short circuit protection circuit). The switching element passes main current between a first terminal and a second terminal thereof when current is imposed to a gate terminal thereof. The over current protection circuit decreases the main current at a first inclination in a case where the over current exceeds a predetermined value (a first threshold value) for a certain period and then it is decreased at a second inclination steeper than the first inclination. The over current restriction circuit instantly decreases the electric voltage of the gate terminal of the semiconductor switching element in a case where the main current exceeds an over current value (a second threshold value) lager than the over current for a period shorter than the certain period at a failure due to short circuit.

DOCUMENT(S) OF PRIOR ART

Patent Document

Patent document 1: Japanese patent No. 4356248

SUMMARY OF THE INVENTION

Problem(s) to be Solved by the Invention

In the conventional semiconductor switching element drive circuit, a problem, however, occurs in a product size and a product cost so that the reliability of the over current protection circuit can be ensured.

Specifically, in the conventional semiconductor switching element drive circuit, a delay circuit is provided to have, what is called, masking time because the current is observed in the both of the over current circuit and the over current restriction circuit, where the possibility of malfunction becomes higher due to the first threshold value of the over current protection circuit being set smaller than the second threshold value of the over current restriction circuit.

In such a semiconductor switching element drive circuit, the main current is suppressed in a short circuit protection state where the main current exceeds the second threshold value to activate the over current restriction circuit. As a result, when the main current is suppressed to fall below the first threshold value, the over current protection circuit becomes out of action, and accordingly the current is not completely interrupted. Therefore, it is need to ensure a margin between a level rage to suppress the main current at the short circuit protection period and a level (the first threshold value) to detect the over current of the over current protection circuit so that they do not overlap with each other.

Herein, there are four methods to set the margin, where the first one is to set the maximum value of the level to suppress the current in the short circuit protection to be the maximum value of failure tolerance of the semiconductor switching element, the second one is to restrict the level range to suppress the current in the short circuit protection operation according to the variation of the gate voltage of the semiconductor switching element, the third one is to restrict the range of the first threshold value for detecting the over current according to the variation of the voltage between a collector and an emitter of the semiconductor switching element, and the fourth one is to add a correction circuit to cancel the variation due to temperature of the semiconductor switching element in the range of the first threshold value.

The four methods, however, rise problems, where the first one causes a chip to be up-sized, the second one and the third one exert an influence upon an yield ratio of products, and the fourth one has an effect to cost and size.

The present invention is made to solve the above problems, and its object is to provide a semiconductor switching element drive circuit that can surely activate an over current protection circuit even when the current value which a short circuit protection circuit restricts varies, suppressing its manufacturing cost and size.

Means for Solving the Problems

In order to achieve the above-described object, a semiconductor switching element drive circuit according to claim 1 of the present invention includes:
a semiconductor switching element that passes main current between a first terminal and a second terminal when a voltage is imposed to a gate terminal;
an over current protection circuit that judges that the main current is judged to become over current exceeding a predetermined current value for a certain period when one of current value and voltage value proportional to an amplitude of the main current exceeds a threshold value, and then the over current protection circuit decreasing the main current;
a short circuit protection circuit that decreases a gate voltage imposed to a gate terminal quicker than a fall of the main current by the over current protection circuit in a case where the main current exceeds the over current for a period shorter than the certain period; and
a threshold value change circuit that decreases the threshold value when the short protection circuit is activated to decrease the main current.

Effect of the Invention

The semiconductor switching element drive circuit according to the invention has the threshold value change circuit that decreases the threshold value when the short protection circuit decreases the main current, and therefore it can surely prevent the semiconductor switching element from breakdown by using the action of the over current protection circuit even when the current value that is restricted by the short circuit protection circuit varies, suppressing its cost and size.

DESCRIPTION OF REFERENCE NUMBERS

Figure 1:
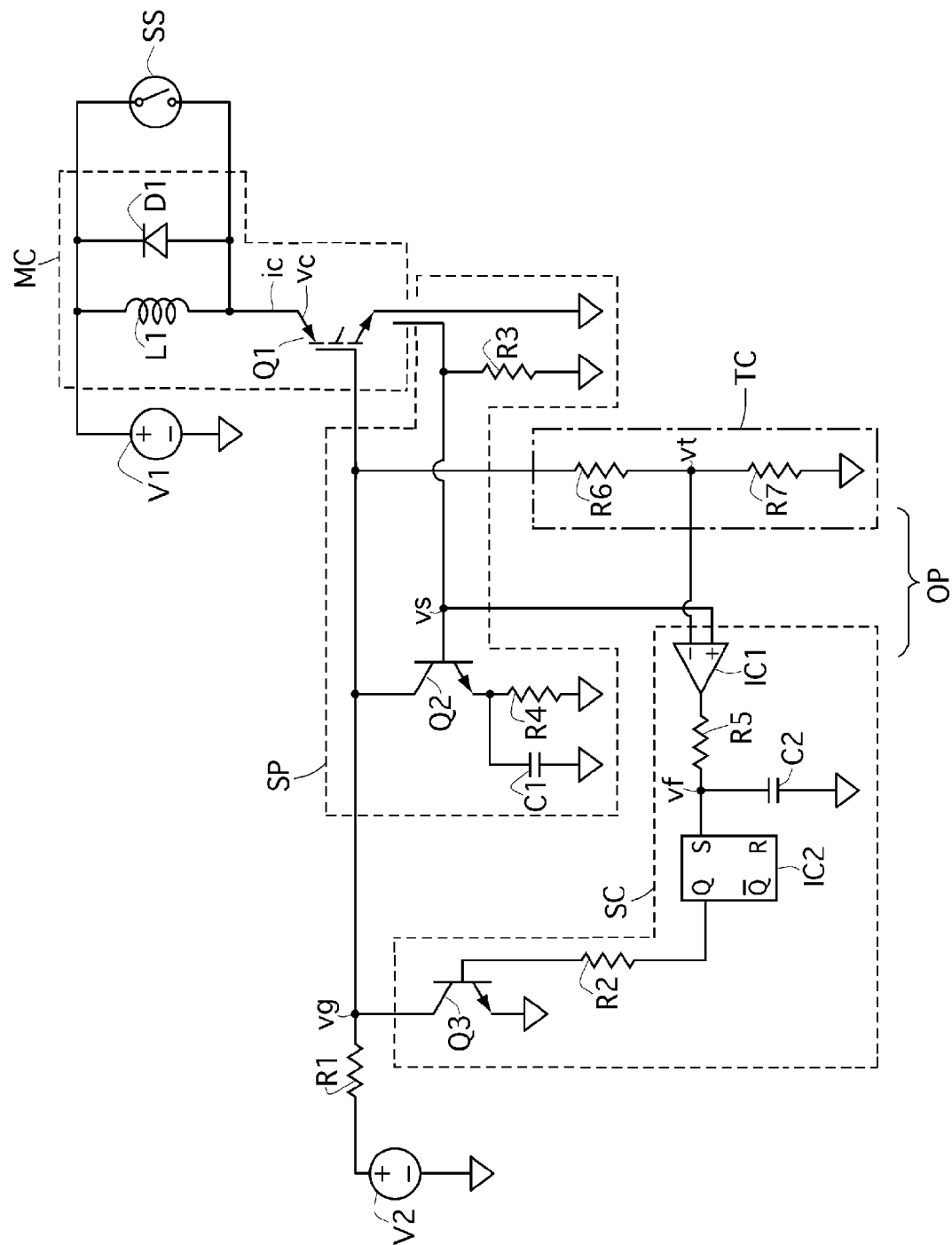
FIG. 1 is a view showing a circuit construction of a semiconductor switching element drive circuit according to a first embodiment of the invention.

Q1 semiconductor switching element (IGBT)
Q2 over current restricting transistor
Q3 gate voltage interrupting transistor
IC1 first comparator
IC2 SR flip-flop
IC3 second comparator
IC4 third comparator
IC5 fourth comparator
IC6 fifth comparator
IC7 sixth comparator
V1 to V9, VS power supply
L1 coil
C1, C2 condenser
D1, D2 diode
SP short circuit protection circuit
OP over current protection circuit
TC over current threshold value voltage setting circuit (threshold value change circuit)
SC switching circuit
SS short circuit switch
ST on-chip temperature sensor (temperature detecting means)

DETAILED DESCRIPTION OF THE INVENTION

Hereinafter, the best mode of the invention will be described in detail based on embodiments shown in the drawings. Incidentally, the same constructed parts and portions of the embodiments are indicated by the same reference numbers, and duplicated explanations thereof will be omitted.

First Embodiment

First, an entire construction of a semiconductor switching element drive circuit of a first embodiment will be described.

The semiconductor switching element drive circuit is used for a motor drive circuit to drive an electric vehicle, for example, employing a known technology using a three-phase alternating current motor in which each coil thereof is supplied with electric power for example. As shown in FIG. 1, the semiconductor switching element drive circuit of the first embodiment includes a circuit MC having motor coils and an inverter, a short circuit protection circuit SP, and an over current protection circuit OP provided with an over current threshold value voltage setting circuit TC and a switching circuit SC. Incidentally, the circuit MC in FIG. 1 uses a part of the motor and a part of a circuit of the inverter for a simulation, but it is essentially the same as those of the known technology.

It has a coil L1 expressing a coil of the motor, a feedback diode D1 connecting parallel to the coil L1, and an insulated gate bipolar transistor (IGBT) functioning as a semiconductor switching element. The motor can be supplied with the electric power from a power supply V1. Incidentally, in order to examine the characteristics of the semiconductor switching element drive circuit of the first embodiment by the simulation, a short circuit switch SS is provided to occur the short circuit of the both end portions of the coil L1 and the feedback diode D1 on purpose, while, not to say, the switch SS is not needed for actual electric vehicles.

The terminal, of the coil L1 and the feedback diode D1, opposite to the power supply V1 is connected to a collector terminal of the IGBT Q1. In the IGBT Q1, an emitter terminal is grounded, and a gate terminal is connected to a power supply V2 thorough a gate resistance R1. The IGBT Q1 controls the current supplied to the coil of the motor by passing the current between the collector terminal and the emitter terminal according to the voltage that is imposed to the gate terminal when the imposed voltage is larger than a predetermined value. Incidentally, one of the collector terminal and the emitter terminal of the IGBT Q1 corresponds to a first terminal of the invention, and the other thereof corresponds to a second terminal of the invention.

The short circuit protection circuit SP includes an over current restricting transistor Q2, a resistance R3, a resistance R4 (corresponding to a short circuit protection resistance of the invention), and a condenser C1.

In the over current restricting transistor Q2, a collector terminal thereof is connected to an intermediate portion between the gate terminal of the IGBT Q1 and the gate resistance R1, and an emitter terminal thereof is grounded through a parallel circuit of the condenser C1 and the resistance R4. On the other hand, a base terminal of the over current restricting transistor Q2 is connected to a sense terminal of the IGBT Q1. Herein, the sense terminal is provided with the IGBT Q1 to detect the current passing therethrough and proportional to the collector current (corresponding to main current).

An intermediate portion between the sense terminal of the IGBT Q1 and the base terminal of the over current restricting transistor Q2 is grounded through the resistance R3, further connected to a non-reverse input terminal of a comparator IC1 of the switching circuit SC. In addition, an intermediate portion between the collector terminal of the over current restricting transistor Q2 and the gate terminal of the IGBT Q1 is connected to a resistance R6 of the over current threshold value voltage setting circuit TC, and an intermediate portion between the collector terminal of the over current restricting transistor Q2 and the gate resistance R1 is connected to the collector terminal of a gate voltage interrupting transistor Q3. Incidentally, gate voltage vg generates at an intermediate portion between the gate resistance R1 and the gate terminal of the IGBT Q1, and sense voltage generates at an intermediate portion between the sense terminal of the IGBT Q1 and the base terminal of the over current restricting transistor Q2.

The over current threshold value voltage setting circuit TC constituting the over current protection circuit OP corresponds to a threshold value change circuit of the invention, having a resistance R6 and a resistance R7 that are arranged in series with each other, where an intermediate portion between the collector terminal of the over current restricting transistor Q2 and the gate terminal of the IGBT Q1 is grounded through the resistances R6 and R7. The over current threshold value voltage vt obtained by voltage-dividing by using the resistances R6 and R7 is imposed to a reverse input terminal of the comparator IC1 of the switching circuit SC.

Similarly, the switching circuit SC sets the gate voltage vg to be zero by removal of noise, delay and latch. It includes the comparator IC1, the gate voltage interrupting transistor Q3, the resistance R2, the resistance R5, the condenser C2 and an SR flip-flop IC2.

In the comparator IC1, as described above, the non-reserve input terminal thereof is imposed with the sense voltage (input voltage) vs, and the reverse input terminal thereof is imposed with the over current threshold value voltage (reference voltage) vt. A judgment signal "High" is outputted from the output terminal when the sense voltage vs exceeds the over current threshold value voltage vt, while a judgment signal "Low" (zero volt) is outputted from the output terminal when it does not exceeds.

The output terminal of the comparator IC1 is connected to a set terminal (s terminal) of the SR flip-flop as a latch circuit through the resistance R5. An intermediate portion between the set terminal and the resistance R5 is grounded through the condenser C2 for removing noise. The output terminal Q of the SR flip-flop IC2 is connected to the base terminal of the gate voltage interrupting transistor Q3. The collector terminal of the gate voltage interrupting transistor Q3 is connected to an intermediate portion between the gate resistance R1 and the collector terminal of the over current restricting transistor Q2, and the emitter terminal thereof is grounded. A filter voltage of generates at an intermediate portion between the resistance R5 and the set terminal (s terminal) of the SR flip-flop IC2.

The operation of the semiconductor switching element drive circuit of the first embodiment constructed above will be described with reference to FIG. 1 to FIG. 3.

Figure 2:
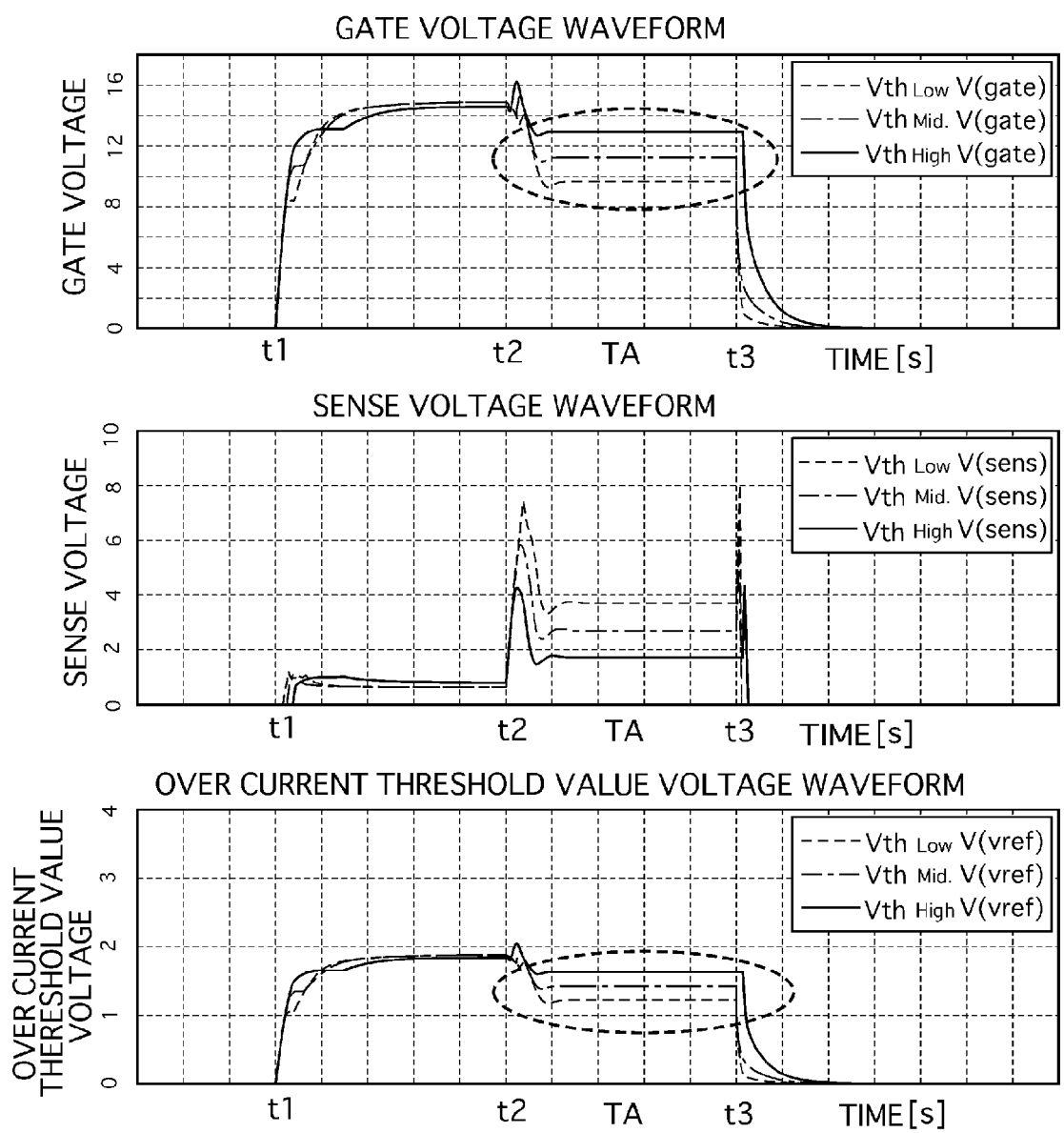
FIG. 2 is a view showing a time chart of an example of operating characteristics of gate voltage, sense voltage, and over current threshold value voltage before and after the occurrence of short circuit in the semiconductor switching element drive circuit of the first embodiment.
Figure 3:
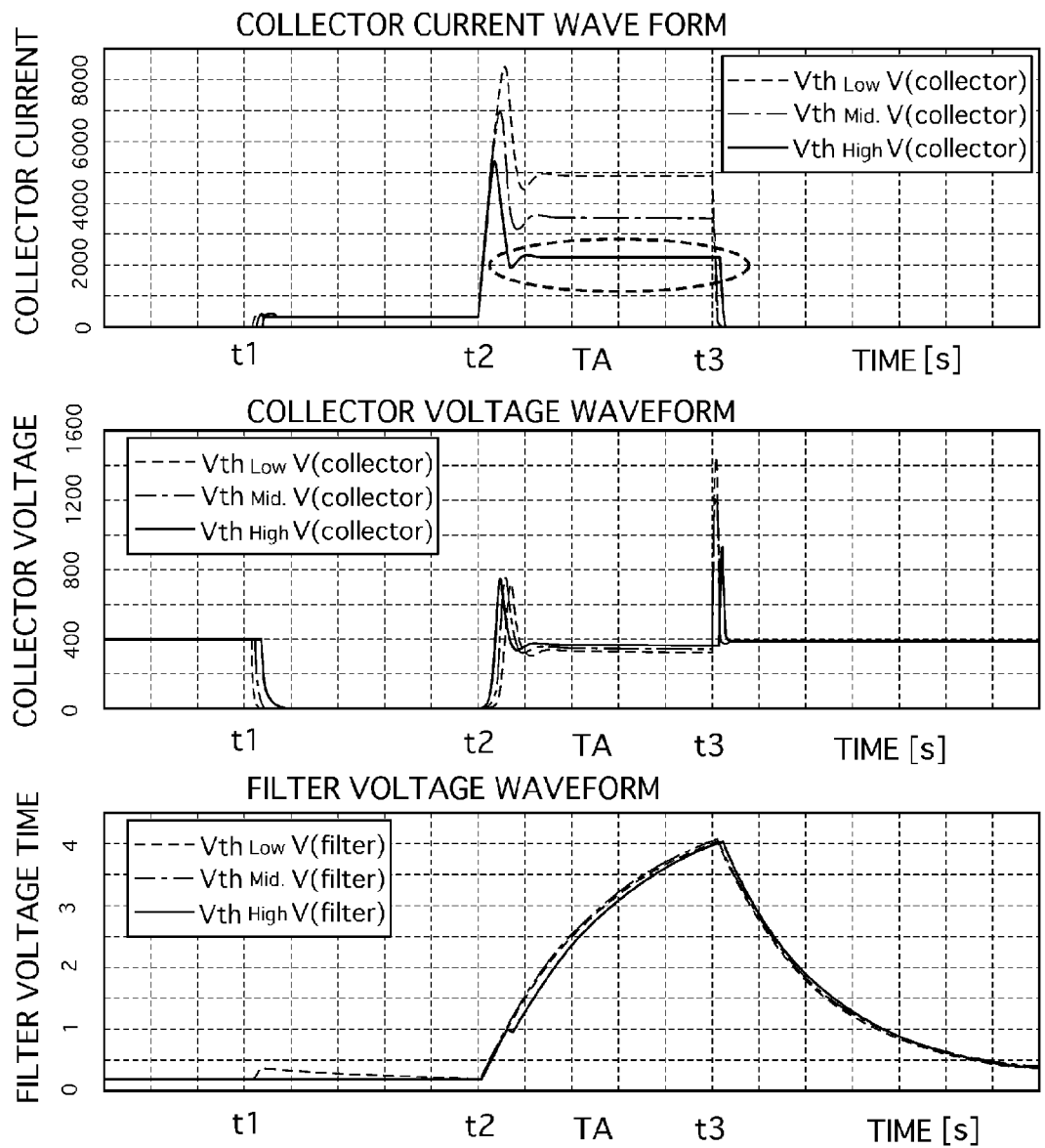
FIG. 3 is a view showing a time chart of an example of operating characteristics of collector current, collector voltage, and filter voltage before and after the occurrence of short circuit in the semiconductor switching element drive circuit of the first embodiment.

Herein, time charts in FIGS. 2 and 3 show the simulation results in a case where the short circuit is occurred (the simulation that is performed by the short circuit switch SS being shifted to "ON"). In these drawings, the time t1 indicates the time when the IGBT Q1 is turned ON, the time t2 indicates the time when short circuit of an arm of the inverter, short circuit of the motor or the like occurs, and the time t3 indicates the time when the over current is detected and the supply of power to the gate terminal of the IGBT Q1 is interrupted. In addition, the period TA (corresponding to a delay time T) indicates the period from the time when the short circuit protection circuit SP becomes activated to the time when the over current is detected and the over current protection circuit OP becomes activated after the delay time T. Incidentally, in each time chart, the simulation results when the threshold value voltage with is low, when it is medium, and when it is high are indicated by a broken line, an alternate long and short dash line, and a solid line, respectively. In addition, the vertical axes of the time charts in FIGS. 2 and 3 are illustrated in scale-down and scale-up, respectively, so that the level values are written to compare with the amplitudes of the reference lines between each other Further, the upper part of the time chart shown in FIG. 2 shows the variation of the gate voltage vg, the middle part thereof shows the variation of the sense voltage vs, and the lower part thereof shows the variation of the over current threshold value voltage vt. The upper part of the time chart shown in FIG. 3 shows the variation of the collector current ic, the middle part thereof shows the variation of the collector voltage, and the lower part thereof shows the variation of the filter voltage.

First, at the time t1, the IGBT Q1 is turned ON to start supplying the power to the coil of the motor. In normal motor drive without the occurrence of the short circuit and the over current, as well as the operation performed by the known technology, the PWM pulse widths of the gate voltage vg of the IGBT Q1 are controlled to change the amplitude of the current passing through the intermediate portion of the collector and the emitter, accordingly each coil of the motor being controlled to a desired attitude, so that necessary drive force is obtained.

In this state, as shown in FIG. 2, the gate voltage vg instantly rises at the time of turn-ON, and then it maintains almost constant amplitude. The rise of the gate voltage vg causes the current to pass from the collector to the emitter, so that the sense current proportional to the collector current is flows. Accordingly, the sense voltage vs, which is determined by the sense current and the resistance R3, rises to a certain amplitude, then maintaining almost constant one. Incidentally, as seen from the simulation results, a little variation can be seen at the rise time between the sense voltages of the IGBT Q1 with different threshold value voltages, but the variation is small so that it is almost negligible.

On the other hand, the threshold value voltage vt rises at the time t1 when the gate voltage vg generates, and it becomes the amplitude of (R7·vg/(R6+R7)) determined by voltage-dividing of the gate voltage vg by using the resistances R6 and 7. At this time, the sense voltage vs is smaller than the over current threshold value voltage vt as shown in FIG. 2, so that the output from the comparator IC1 of the switching circuit SC is Low and the filter voltage of maintains the smallest amplitude (a small value such as error amount and/or a drift amount due to the output characteristics of the comparator IC1) as shown in FIG. 3. Consequently, the switching circuit SC of the over current protection circuit OP is out of action, and the gate voltage interrupting transistor Q3 maintains an OFF state to interrupt the gate terminal side from the ground.

In addition, at the same time, the sense voltage vs is imposed to the base terminal of the over current restricting transistor Q2. This value, however, is lower than the threshold value voltage of the over current restricting transistor Q2, so that the over current restricting transistor Q2 maintains an OFF state where the collector thereof is blocked off from the emitter thereof. As a result, the short circuit protection circuit SP is out of action. Accordingly, the gate terminal of the IGBT Q1 is not grounded through the condenser C1 and the resistance R4 to supply the power to the coil to drive the motor.

Incidentally, as shown in FIG. 3, the collector current ic does not run in the IGBT Q1 before the turn-ON, while, as the IGBT Q1 is originally constructed so that the collector voltage is set to become higher than the emitter voltage, the collector voltage vc generates at the difference therebetween.

On the other hand, the collector current (corresponding to the main current of the invention) according to the amplitude of the gate voltage vg begins to pass between the collector and the emitter at the time t1 when the gate voltage vg starts to be imposed, which causes the collector current ic to rise and then it maintains a certain amplitude. When the collector current ic passes the emitter (that is, being biased in a forward direction), the collector voltage vc falls to the smallest amplitude (almost zero volt).

In this state, the short circuit of the arm of the inverter occurs at the time t2, for example. In order to simulate this short circuit state, the sort circuit switch SS shown in FIG. 1 is turned ON.

Then, the collector current ic instantly becomes large to become the over current at the time t2.

At this time, the sense voltage vs rises to a large amplitude to act the short circuit protection circuit SP.

Specifically, the sense voltage vs that has become larger than the threshold value voltage of the over current restricting transistor Q2 according to the over current is imposed to the base terminal of the over current restricting transistor Q2. This causes the over current restricting transistor Q2 to be in a state where it can be turned ON to pass the current. Consequently, the current imposed to the gate terminal of the IGBT Q1 passes between the collector and the emitter of the over current restricting transistor Q2, then to the ground through the resistance R4. Accordingly, the attitude of the gate voltage vg rapidly falls to the certain voltage attitude where the gate current and the sense voltage are balanced with each other.

Thus, to control the gate voltage can suppress the increase in the collector current ic to protect the IGBT Q1 from breakdown.

Incidentally, the resistance R4 is connected to the condenser C1 parallel to the resistance R4 and between the emitter and the ground to rapidly discharge its high frequency components to the ground. The resistance R4 stably maintains the certain voltage.

Therefore, the short circuit protection circuit SP instantly restricts the amplitude of the gate voltage vg when the short circuit occurs.

The smaller the fall in the gate voltage vg during the operation of the short circuit protection circuit SP becomes, the smaller the threshold value voltage vth of the IGBT Q1 is set to be during the period TA as indicated in an area surrounded by an ellipsoidal broken line in the upper time chart in FIG. 2. In this case, it can be seen that the variation has an appreciable width (the variation is large) according to the threshold value voltages vth, which is different from that in the case before the time t2.

On the other hand, the over current threshold value voltage vt has the value that is obtained by volt-dividing the gate voltage vg by using the resistances R6 and R7 to be proportional to the amplitude of the gate voltage vg, so that the smaller it becomes the smaller the amplitude of the gate voltage vg becomes as indicated in an area surrounded by an ellipsoidal broken line in the lower time chart in FIG. 2. In addition, in this case, the over circuit threshold value voltage vt becomes smaller in the IGBT with the smaller threshold value voltage vth. In this case, it can be also seen to have an appreciable width.

The over current threshold value voltage vt is inputted to the reverse input terminal of the comparator IC1, where its amplitude is compared to that of the sense voltage vs inputted to the non-reverse input terminal.

Herein, the sense voltage vs largely rises at the time t2, and the collector current ic rises to the amplitude larger than that of the collector current between the time t1 and the time t2, and then it is maintained at this amplitude due to the restriction of the fall of the gate voltage vg during the period TA as shown in the upper time chart shown in FIG. 3. In this case, the collector current ic rises slowly at the time t2 and its maximum attitude becomes larger, maintaining a larger attitude thereafter. It can be seen that the width of variation is considerably large.

Incidentally, during the period TA, the collector voltage vc rises to the amplitude similar to that in the OFF state before the time t1 because the gate voltage vg is lowered to the above amplitude.

During the period TA, the amplitude of the sense voltage vs varies in the level of 1.9 to 3.9 as shown in FIG. 2, and the over current threshold value voltage vt at the level of 1.3 to 1.7 is surely smaller than that of the sense voltage vs. Consequently, the comparator IC1 outputs a signal of High level, inputting it to the condenser C2 and the set terminal of the SR flip-flop IC2 through the resistance R5.

This High level signal starts to be charged in the condenser C2 from the time t2 as shown in the lower time chart in FIG. 3, so that the filter voltage vf gradually rises. At the time t3 after the delay time T (what is called, the masking time) from the time t2, it imposes the filter voltage vf, corresponding to a logic value 1, to the set terminal of the SR flip-flop IC2. Incidentally, the condense C2 further functions to fulfill a noise removal function.

Thus, at the time when the filter voltage vf corresponding to the logic value 1 is inputted to the set terminal of the SR flip-flop IC2, the output terminal Q outputs output voltage corresponding to an output value 1. This voltage is inputted to the base terminal of the gate voltage interrupting transistor Q3 through the resistance R2 to turn it ON. This causes the immediate portion between the resistance R1 and the gate terminal of the IGBT Q1 to be grounded through the collector and the emitter of the gate voltage interrupting transistor Q3, thereby lowering the gate voltage vg to zero volt.

Consequently, the IGBT Q1 is forced to be turned OFF, and the collector current is also becomes zero volt. This protects the IGBT Q1 from the breakdown due to the over current.

After the time t3, the sense voltage vs falls and the output of the comparator IC1 becomes the Low level, which the electricity charged in the condense C2 is discharged. Accordingly, the filter voltage vf starts to fall, and it becomes the input amplitude of Low, which is inputted to the set terminal of the SR flip-flop IC2. The SR flip-flop IC2 functions as the latch circuit to maintain the previous state (the output logic value 1). Therefore, there is no possibility of the gate voltage vg rising again.

Incidentally, as seen from the simulation results in FIG. 2, the smaller the sense voltage vs becomes in the IGBT with the larger the threshold value voltage vth. Accordingly, in the conventional technology where the over current threshold value voltage vt is maintained to be a constant amplitude, the sense voltage vs cannot exceed the over current threshold value voltage vt. This keeps the output of the comparator IC1 zero. Accordingly, the over current protection circuit OP does not act, which causes the IGBT Q1 to be finally broken.

In the semiconductor switching element drive circuit of the first embodiment, the gate voltage vg is, however, restricted, at an instant time of the occurrence of short circuit, to lower the amplitude of the over current threshold value voltage vt. At the time t3 after the delay time T, the sense voltage vs surely exceeds the over current threshold value voltage vt. Therefore, the over current protection circuit OP can be surely acted.

Next, the effects of the semiconductor switching element drive circuit of the first embodiment will be described.

In the semiconductor switching element drive circuit of the first embodiment, the over current threshold value voltage vt is obtained by volt-dividing the gate voltage vg by using the resistances R6 and R7. This causes the short circuit protection circuit SP to restrict the amplitude of the gate voltage vg of the IGBT Q1 and then it decrease the over current threshold value voltage vt according to the fall of the gate voltage vg.

Therefore, when the action of the switching circuit SC of the over current protection circuit OP is judged based on the comparison of the sense voltage vs (being concerned with the collector current is as the main current) to the lower over current threshold value voltage vt by using the comparator IC1, the sense voltage vs can surely exceed the over current threshold value voltage vt in any IGBT with different threshold value voltages with at the occurrence of the over current. Consequently, the over current protection circuit OP surely acts to protect the IGBT Q1 from the breakdown thereof.

In other words, even when the limit current value at the short circuit protection may be lowered, the over current protection circuit OP can surly act. This allows the semiconductor elements such as the IGBT Q1 to be set lower in the specification of heat resistance property (the capacity of bearing against the heat generated when high current runs in short time). Therefore, the semiconductors can be downsized, and their costs can be decreased. In addition, the construction of the first embodiment can be obtained by a small change and addition of parts, which also decreases costs and sizes.

Second Embodiment

Next, a semiconductor switching element drive circuit of a second embodiment according to the present invention will be described with reference to FIGS. 4 to 6.

Figure 4:
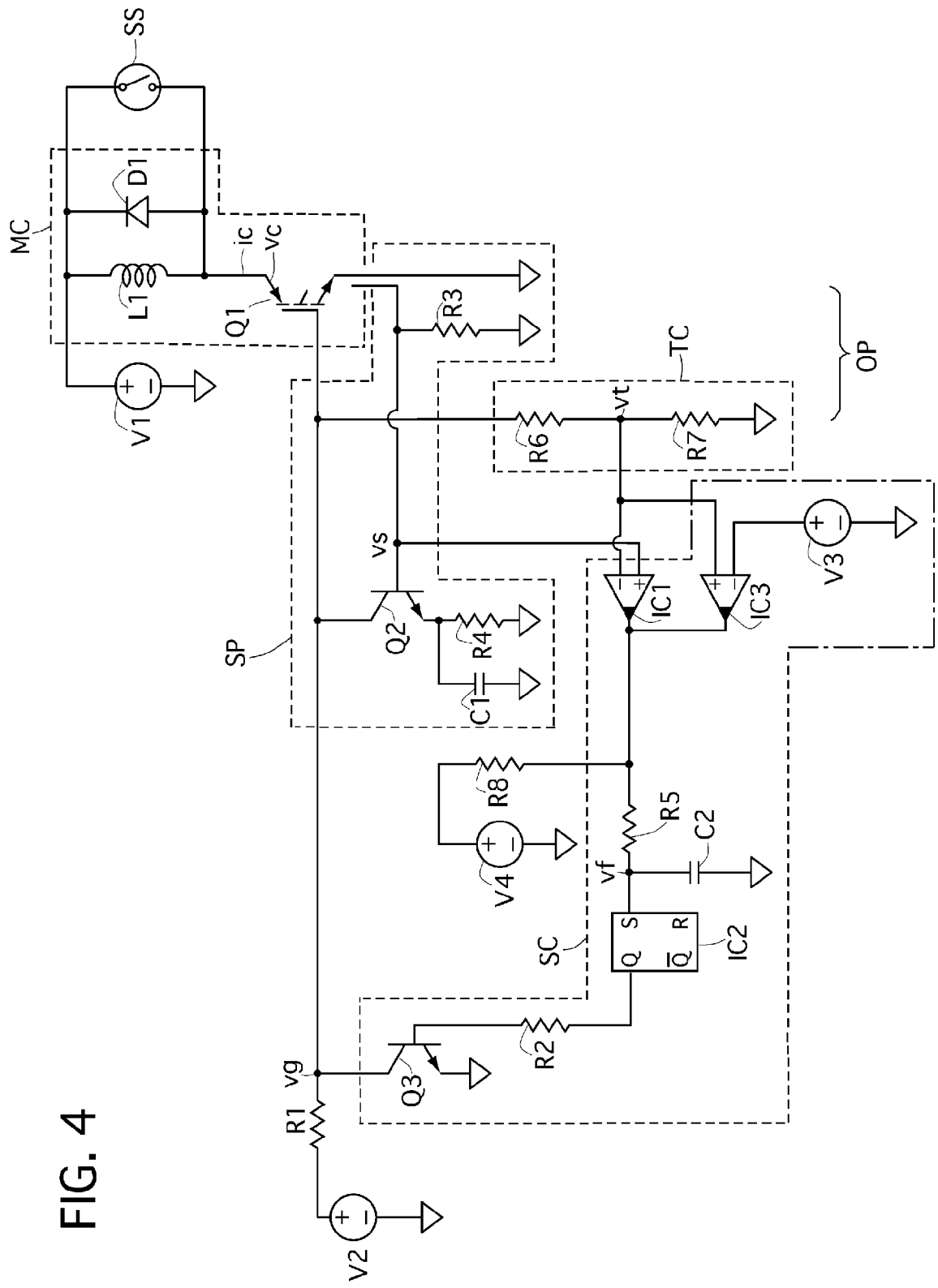
FIG. 4 is a view showing a circuit construction of a semiconductor switching element drive circuit according to a second embodiment of the invention.

As shown in FIG. 4, the semiconductor switching element drive circuit of the second embodiment is different from the first embodiment in a circuit for setting masking time used in the switching circuit SS of the over current protection circuit OP.

That is, the over current threshold value voltage vt obtained by volt-dividing the gate voltage vg by using the resistances R6 and R7 in the over current threshold value setting circuit TC is imposed to the reverse input terminal of the first comparator IC1 similarly to the first embodiment, also being imposed to a non-reverse input terminal of a second comparator IC3 that is arranged parallel to the first comparator IC1. In addition, the sense voltage vs is inputted to the non-reverse input terminal of the first comparator IC1 similarly to the first embodiment, while a certain voltage from a power supply V3 is inputted to a reverse input terminal of the second comparator IC3. Herein, the first comparator IC1 and the second comparator IC3 employ an open collector output type OR circuit where the output terminals of the both comparators are connected to each other.

The output terminals of the first comparator IC1 and the second comparator IC3 are connected to a resistance R5. An intermediate portion between the resistance R5 and the both output terminals is connected to a power supply V4 through an external pull-up resistance R8. The other construction is similar to that of the first embodiment.

In the thus-conducted semiconductor switching element drive circuit of the second embodiment, the voltage imposed to the output terminals of the first comparator IC1 and the second comparator IC3 and the resistance R5 is explained below. Incidentally, in the following explanation, an index (*) of the output indicates that the output of the comparator becomes the High level due to the resistance R8 when its outputting transistor is OFF, because the comparator employs the open collector output type. The output signal imposed to the resistance R8 becomes the High level in a case where the both outputs of the first and second comparators IC1 and IC3 are at the High level, while it becomes the Low level in a case where either of the first and second comparators IC1 and IC3 becomes the Low level, because the outputs of the comparators are formed as a wired OR.

That is, the output of the first comparator IC1 becomes the High (*) level and the output of the second comparator IC3 becomes the Low level at vt<vs and vt<v3, so that the output signal imposed to the resistance R8 becomes the Low level. On the other hand, the both outputs of the first and second comparators IC1 and IC3 become the High (*) level at v3<vt<vs, so that the output signal imposed to the resistance R8 becomes the High level. The output of the first comparator IC1 becomes the Low level and the output of the second comparator IC3 becomes the High (*) level at v3<vt and vs<vt, so that the output signal imposed to the resistance R8 becomes the Low level.

Therefore, although the output signal of the first comparator IC1 might become unstable when the sense voltage vs and the over current threshold value voltage vt are in the vicinity of zero, the circuit described above surely make the output signal the Low level. This output signal is imposed to the resistance R8 and the condenser C2, so that the rise of the filter voltage of is suppressed and masked by the resistance R8 and the condenser C2 at a range where the gate voltage vg is in the vicinity of zero. Consequently, only the Low level is inputted to the set input terminal S of the SR flip-flop.

Figure 5:
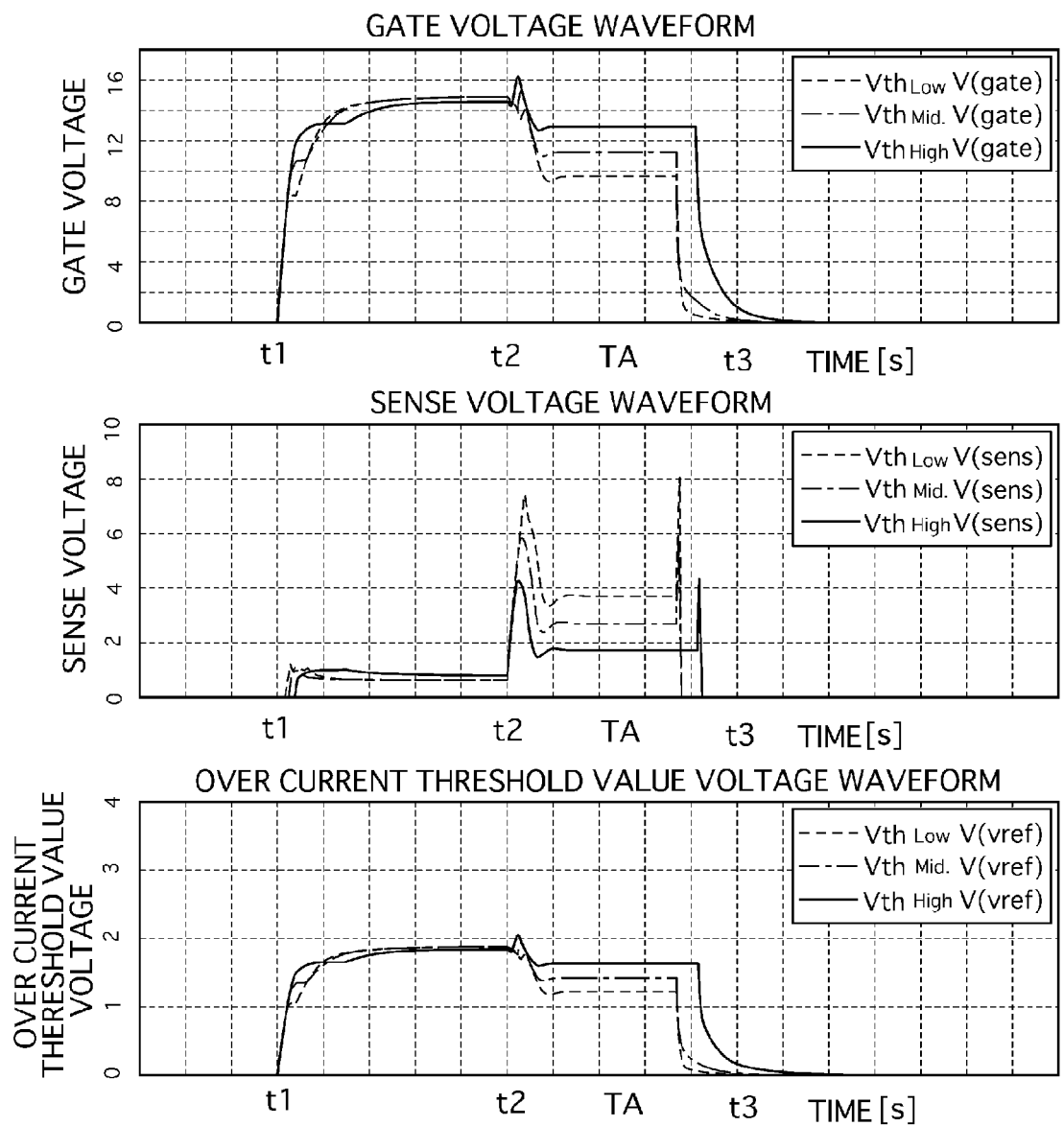
FIG. 5 is a view showing a time chart of an example of operating characteristics of gate voltage, sense voltage, and over current threshold value voltage before and after the occurrence of short circuit in the semiconductor switching element drive circuit of the second embodiment.
Figure 6:
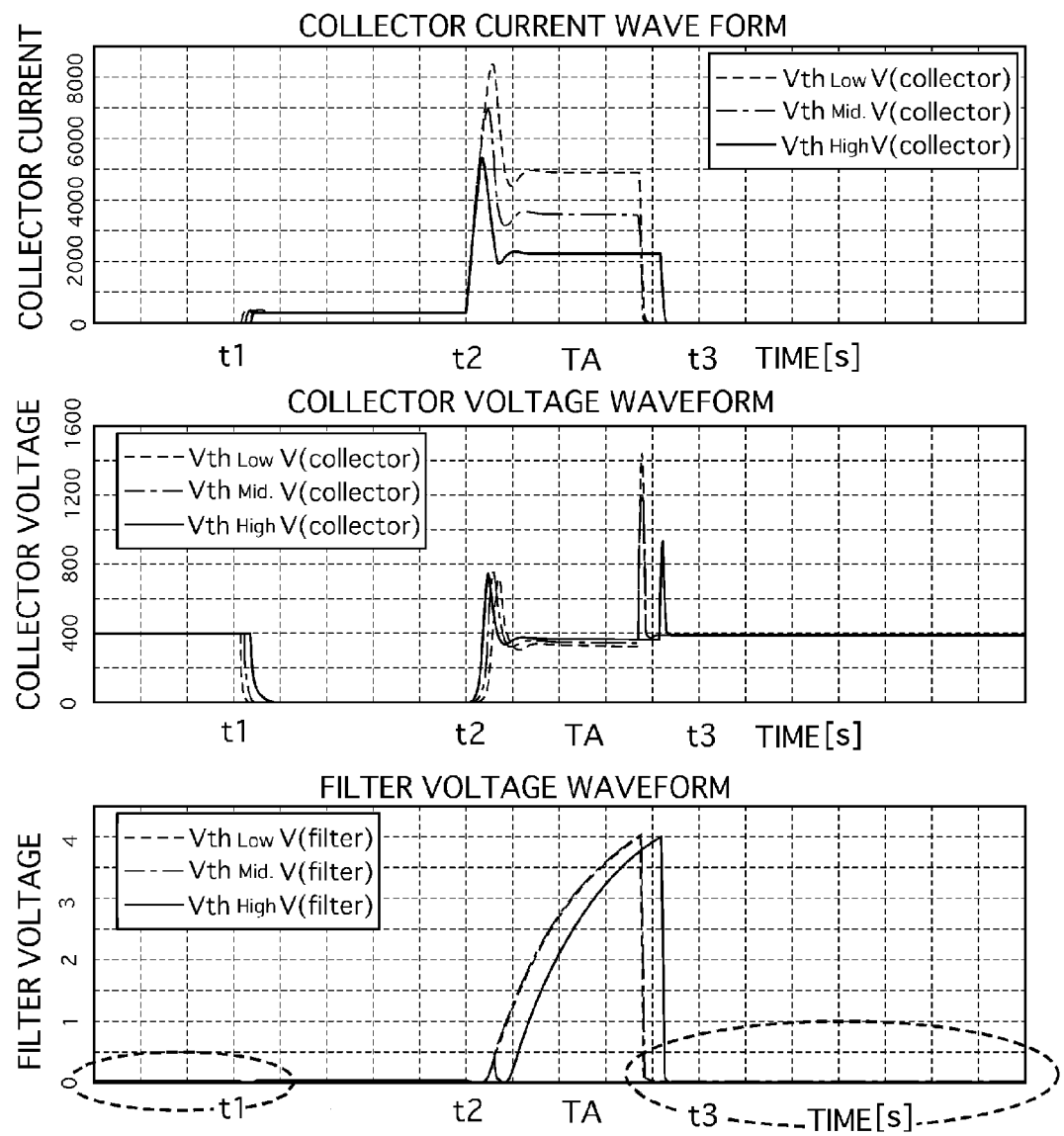
FIG. 6 is a view showing a time chart of an example of operating characteristics of collector current, collector voltage, and filter voltage before and after the occurrence of short circuit in the semiconductor switching element drive circuit of the second embodiment.

FIGS. 5 and 6 correspond to FIGS. 2 and 3 of the first embodiment, respectively. All of the time charts in FIG. 4 and the upper and lower time charts in FIG. 5 are similar to the corresponding those of the first embodiment shown in FIGS. 2 and 3, while the lower time chart in FIG. 6 is different from that of the first embodiment.

That is, as shown in the lower time chart in FIG. 6, when the gate voltage in a state where the IGBT Q1 is OFF is in the vicinity of zero, the both inputs to the first comparator IC1 become approximately zero at the range surrounded by an ellipsoidal broken line at the left side in FIG. 6 (before the time t1 and after the time t3), and it can be understood that the occurrence of the unstable voltage is avoided as shown in the lower time chart in FIG. 3. Incidentally, in the period from the time t1 to the time t2, the gate voltage vg has a certain amplitude and the sense voltage vs is smaller than the over current threshold value voltage vt, so that the signal becomes the Low level.

Therefore, in the semiconductor switching element drive circuit of the second embodiment can provide the following effects in addition to those of the first embodiment.

The filter voltage vf is fixed to the Low level, being masked by the open collector type first and second comparators IC1 and IC3 even when the gate voltage vg is in the vicinity of zero volt. Therefore, the first comparator IC1 can be kept stable even when the gate voltage vf is in the vicinity of zero volt.

Third Embodiment

Next, a semiconductor switching element drive circuit of a third embodiment according to the present invention will be described with reference to FIGS. 7 to 9.

Figure 7:
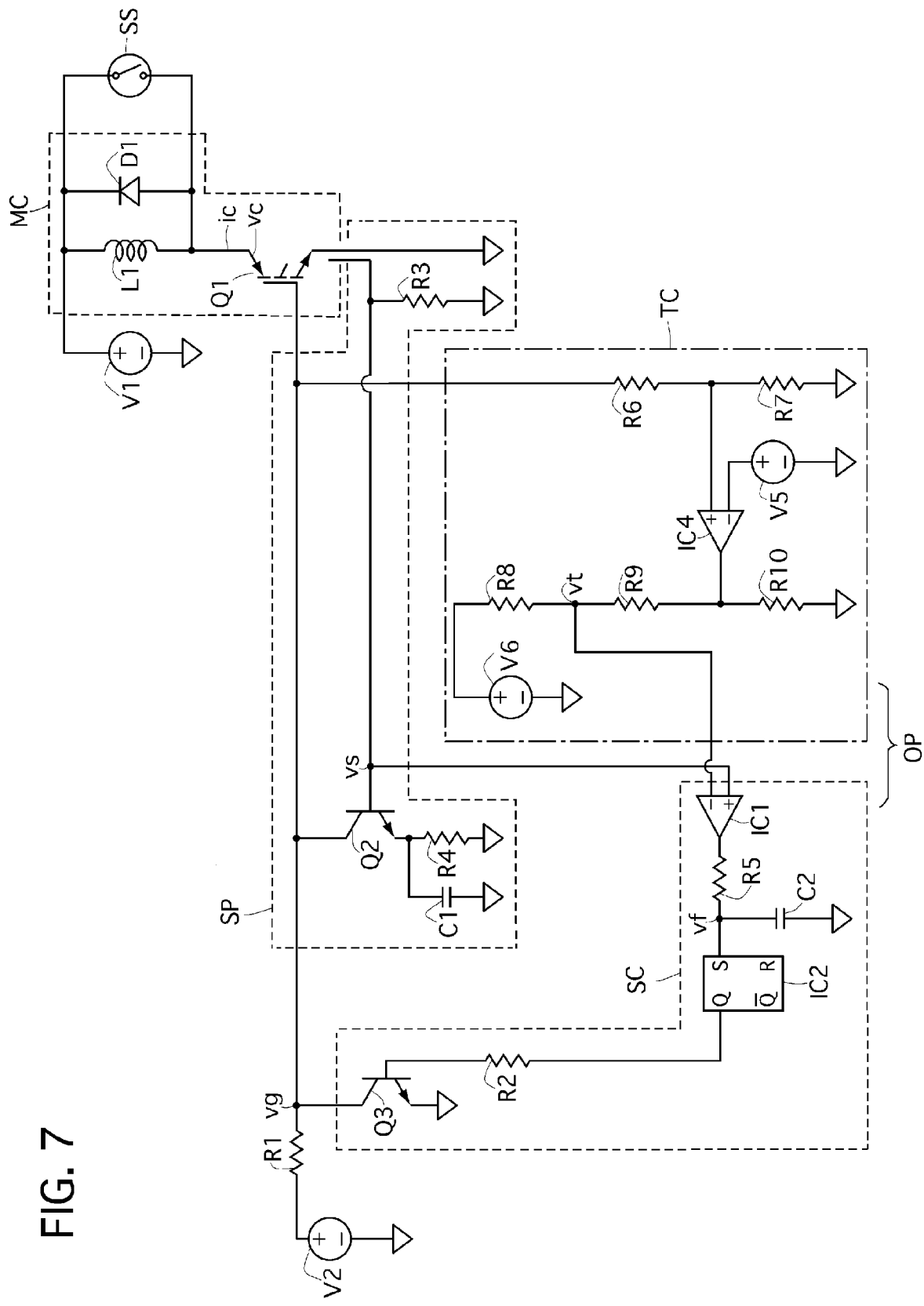
FIG. 7 is a view showing a circuit construction of a semiconductor switching element drive circuit according to a third embodiment of the invention.

As shown in FIG. 7, the semiconductor switching element drive circuit of a third embodiment is different from the first embodiment in the over current threshold value setting circuit TC.

That is, in the semiconductor switching element drive circuit of the third embodiment, an intermediate portion between the resistance R6 and the resistance R7 is connected to a non-reverse input terminal of a third comparator IC4, and a reverse input terminal thereof is connected to a power supply V5, being imposed with a certain voltage. The output terminal of the third comparator IC4 is connected to an intermediate portion between the resistances R9 and R10 arranged in series. The other end portion f the resistance R10 is grounded, while the other end portion of the resistance R9 is connected to a power supply V6 through a resistance R8. An intermediate portion between the resistances R8 and R9 is connected to the reverse input terminal of the first comparator IC1, which is imposed with the over current threshold value voltage vt. The non-reverse input terminal of the first comparator IC1 is imposed with the sense voltage vs. The other construction is similar of that of the first embodiment.

In the semiconductor switching element drive circuit of the third embodiment, the voltage (corresponding to the over current threshold value voltage in the first embodiment) obtained by dividing the gate voltage vg by the resistances R6 and R7 varies according to the amplitude of the gate voltage. When the gate voltage is higher than that of the power supply V5, the output voltage High is outputted to the intermediate portion of the resistances R9 and R10. When it is lower, the output voltage Low is outputted thereto.

Accordingly, the over current threshold value voltage vt generated between the resistances R8 and R9 becomes to have the amplitude obtained by volt-dividing the difference voltage between the power supply V6 and the output voltage by using the resistances R8 and R9. When the output of the third comparator IC4 is High, the over current threshold value voltage vt becomes the divided voltage of the difference between the High voltage and the voltage of the power supply V6 volt-divided by using the resistances R8 and R9. When the output of the third comparator IC4 is Low, the over current threshold value voltage vt becomes the divided voltage of the difference between the Low voltage and the voltage of the power supply V6 volt-divided by using the resistances R8 and R9. That is, the over current threshold value voltage vt is not affected by the variation of the gate voltage vg.

Figure 8:
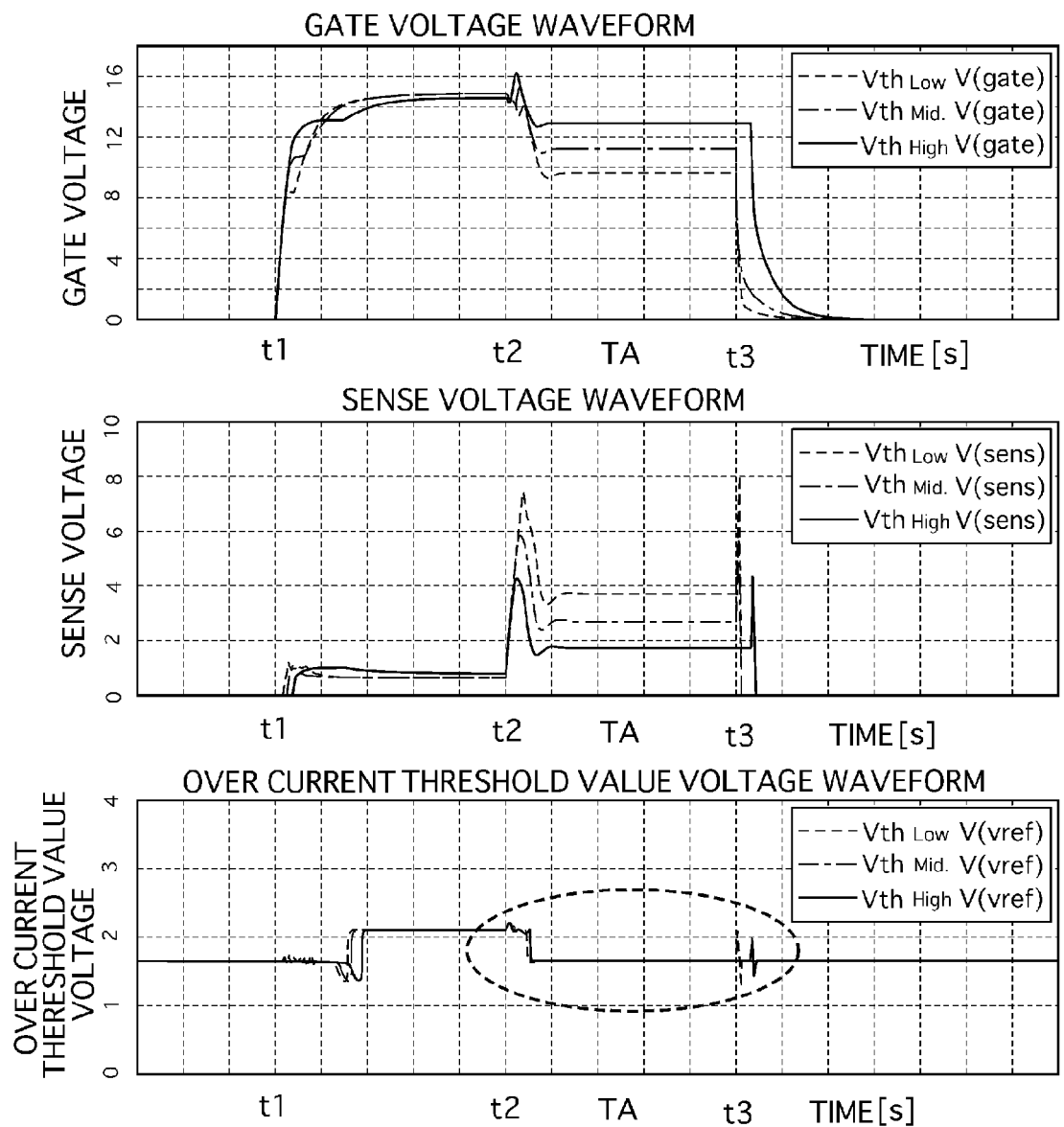
FIG. 8 is a view showing a time chart of an example of operating characteristics of gate voltage, sense voltage, and over current threshold value voltage before and after the occurrence of short circuit in the semiconductor switching element drive circuit of the third embodiment.
Figure 9:
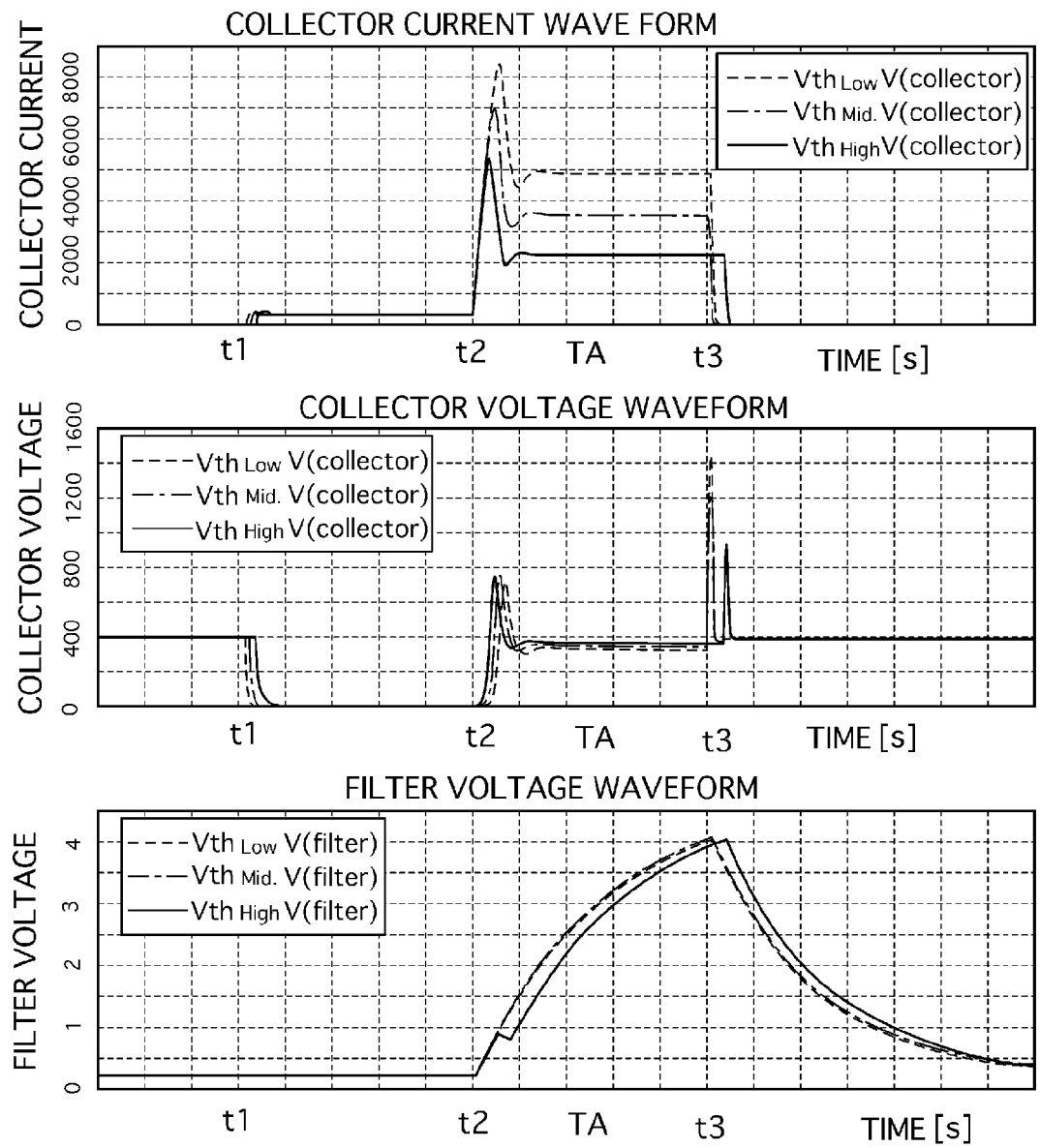
FIG. 9 is a view showing a time chart of an example of operating characteristics of collector current, collector voltage, and filter voltage before and after the occurrence of short circuit in the semiconductor switching element drive circuit of the third embodiment.

Incidentally, FIGS. 8 and 9 correspond to FIGS. 2 and 3 of the first embodiment, respectively. The upper and middle time charts in FIG. 8 and all the time charts in FIG. 9 are similar to the corresponding time charts of the first embodiment shown in FIGS. 2 and 3, while the lower time chart in FIG. 8 is different from that of the first embodiment.

That is, as shown in the lower time chart in FIG. 8, in the period TA as indicated an ellipsoidal broken line, the variation is suppressed compared to that in the first embodiment.

As described above, the semiconductor switching element drive circuit of the third embodiment can provide the following effects in addition to those of the first embodiments. That is, the third comparator IC4 is provided to output High and Low signals according to the gate voltage vg, and the difference of the output voltage and the voltage of the power supply V6 is volt-divided by using the resistances R8 and R9 to obtain the over current threshold value voltage vt. Therefore, the over current threshold value voltage vt is determined by the power supply V6, the voltage of the power supply of the third comparator IC4, and the resistances R8, R9 and R10. Consequently, it is not affected by the gate voltage vg varying according to the characteristics of the semiconductor switching element, and its amplitude can be stable.

Fourth Embodiment

Next, a semiconductor switching element drive circuit of a fourth embodiment according to the present invention will be described with reference to FIGS. 10 to 12.

Figure 10:
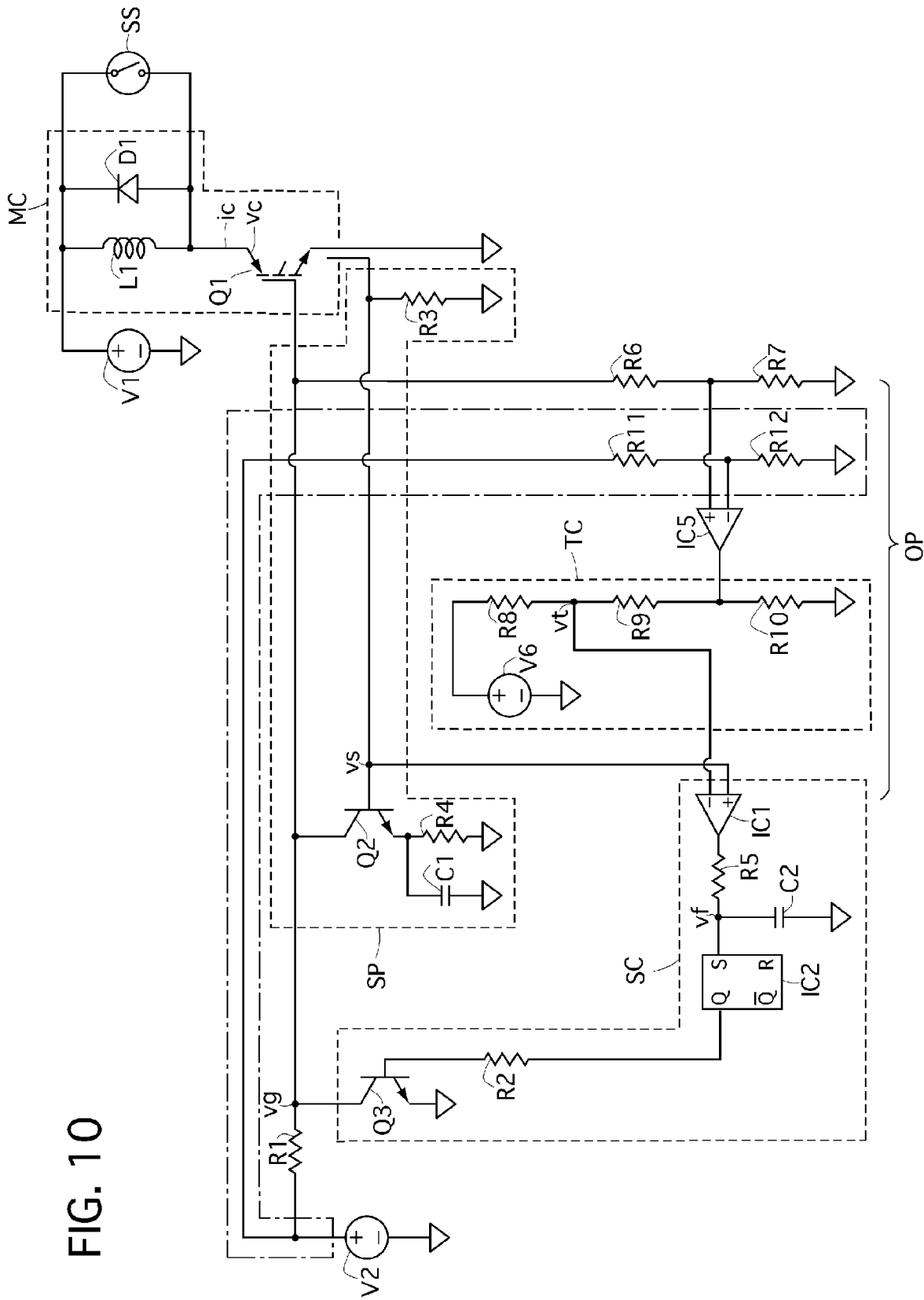
FIG. 10 is a view showing a circuit construction of a semiconductor switching element drive circuit according to a fourth embodiment of the invention.

As shown in FIG. 10, the semiconductor switching element drive circuit of the fourth embodiment is different from the third embodiment in the over current threshold value voltage setting circuit TC.

That is, in the semiconductor switching element drive circuit of the fourth embodiment, a non-reverse input terminal of the fourth comparator IC5 is connected to the intermediate portion of the resistances R6 and R7 similarly to the third embodiment, while its reverse input terminal is connected to an intermediate portion between resistances R11 and R12 arranged in series between the power supply V2 and the ground. The other construction is similar to that of the third embodiment.

Figure 11:
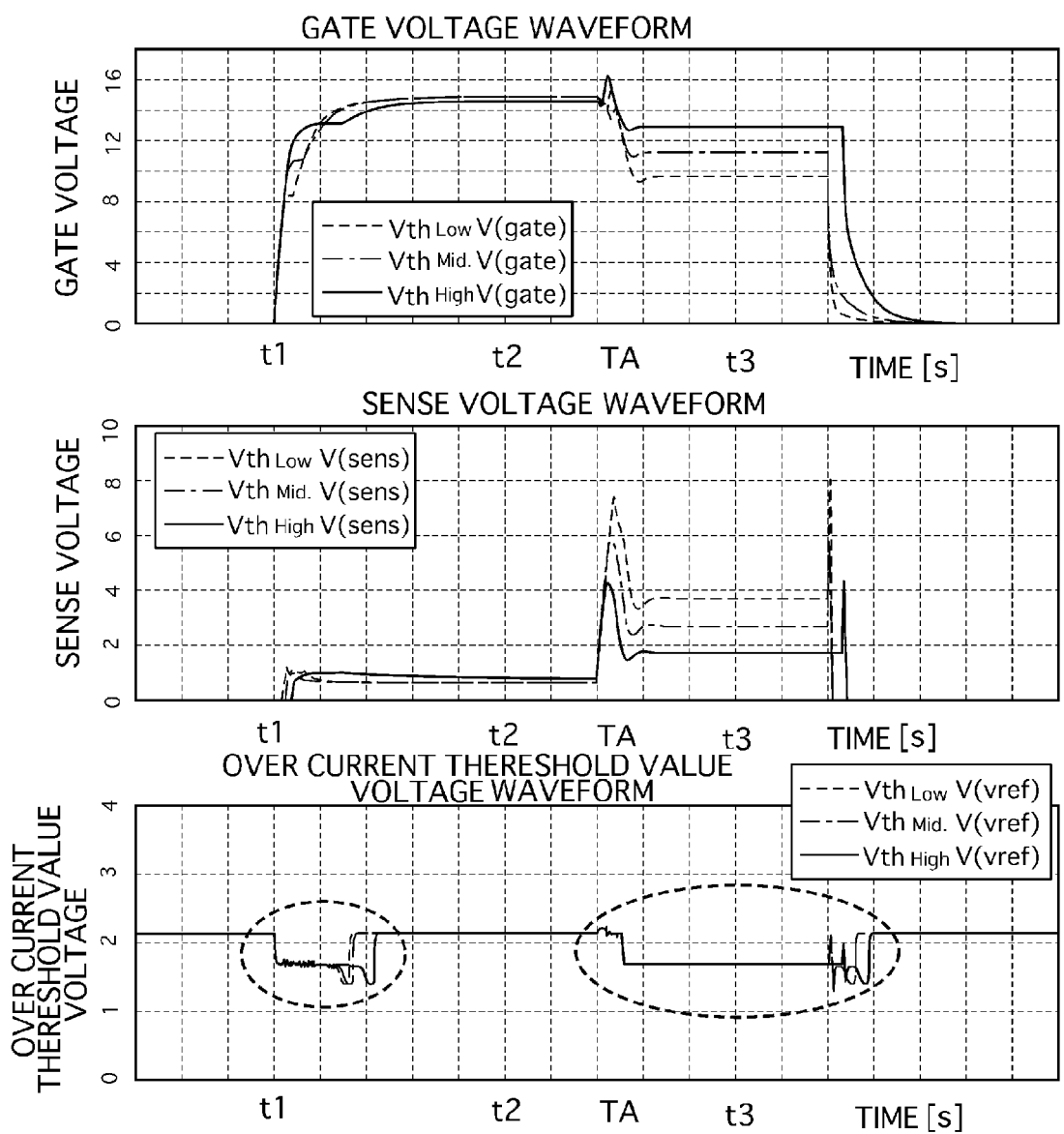
FIG. 11 is a view showing a time chart of an example of operating characteristics of gate voltage, sense voltage, and over current threshold value voltage before and after the occurrence of short circuit in the semiconductor switching element drive circuit of the fourth embodiment.
Figure 12:
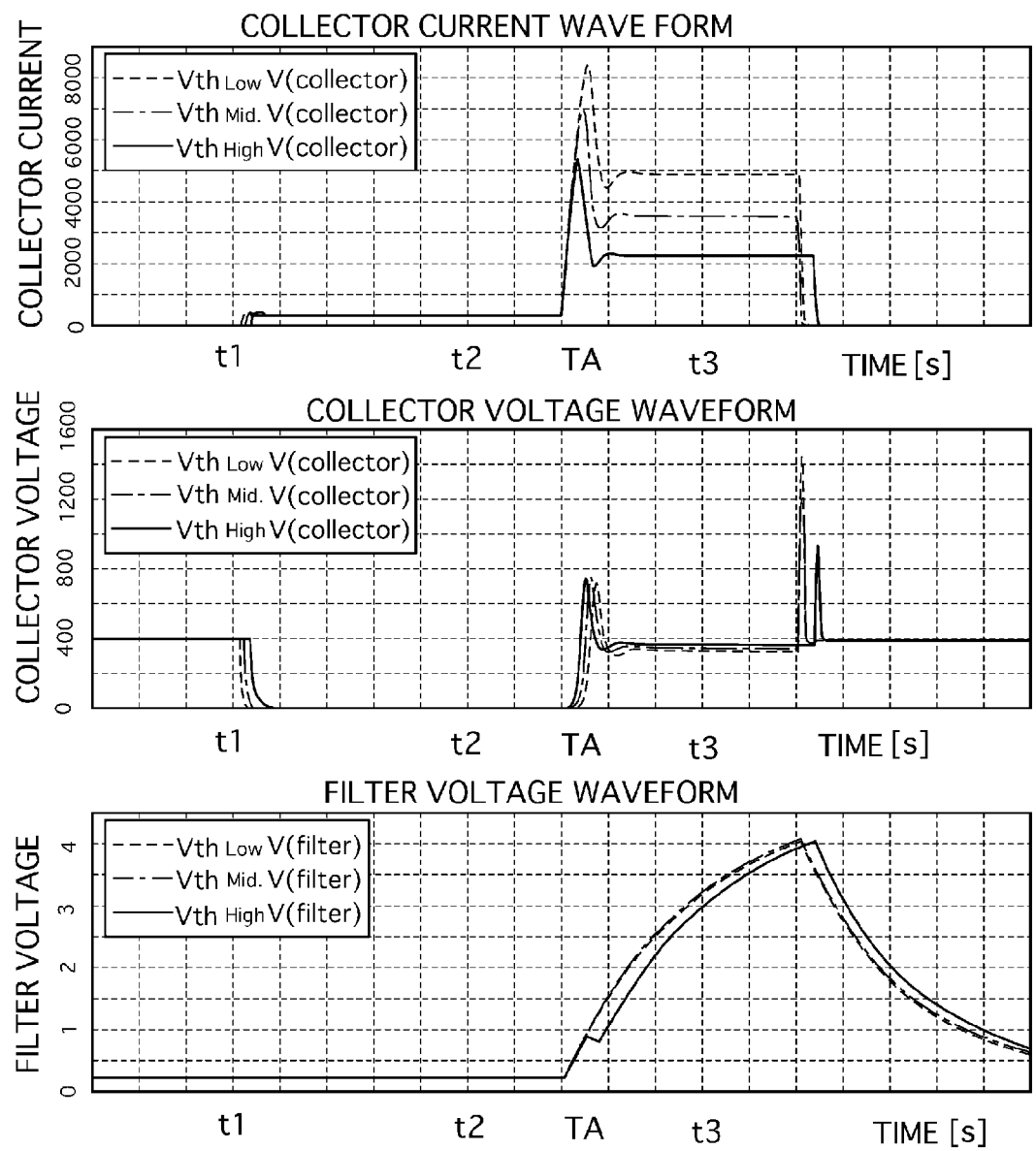
FIG. 12 is a view showing a time chart of an example of operating characteristics of collector current, collector voltage, and filter voltage before and after the occurrence of short circuit in the semiconductor switching element drive circuit of the fourth embodiment.

Incidentally, FIGS. 11 and 12 correspond to FIGS. 2 and 3 of the first embodiment, respectively. The upper and middle time charts in FIG. 11 and all the time charts in FIG. 12 are similar to the corresponding time charts in FIGS. 2 and 3 of the first embodiment. The lower time chart in FIG. 11 is different from that of the first embodiment.

As shown in the upper time chart, in a state of the short circuit protection, the over current restricting transistor Q2 forces to decrease the voltage of the gate terminal of the IGBT Q1 regardless of the ON state of the gate. The difference voltage is imposed to the gate resistance R1, so that a potential difference generates between the both ends of the gate resistance R1.

That is, the fourth comparator compares the gate side voltage obtained by volt-dividing the gate voltage vg by using the resistances R6 and R7 to the power supply side voltage obtained by volt-dividing the voltage of the power supply V2 by using the resistances R11 and R12. When the gate side voltage becomes higher than the power supply side voltage, the High signal is outputted, while the Low signal is outputted when the gate side voltage becomes lower than the power supply side voltage.

Accordingly, the over current threshold value voltage vt varies due to malfunction as shown in FIG. 11 when the IGBTG Q1 is turned ON as indicated by an ellipsoidal broken line at the left side similarly to the third embodiment. There is, however, no problem in the variation because the noise can be removed.

The semiconductor switching element drive circuit of the fourth embodiment can provide the effects similar to those of the third embodiment.

Further, in the fourth embodiment, the two inputs of the fourth comparator, which judges whether the short circuit protection circuit acts or not, in other words, whether the gate voltage vg varies or not, can be the values variable in proportion to the variation of the power supply V2. This can prevent the judgment from being changed due to the variation of the power supply V2.

Fifth Embodiment

Next, a semiconductor switching element drive circuit of a fifth embodiment according to the present invention will be described with reference to FIGS. 13 to 15.

Figure 13:
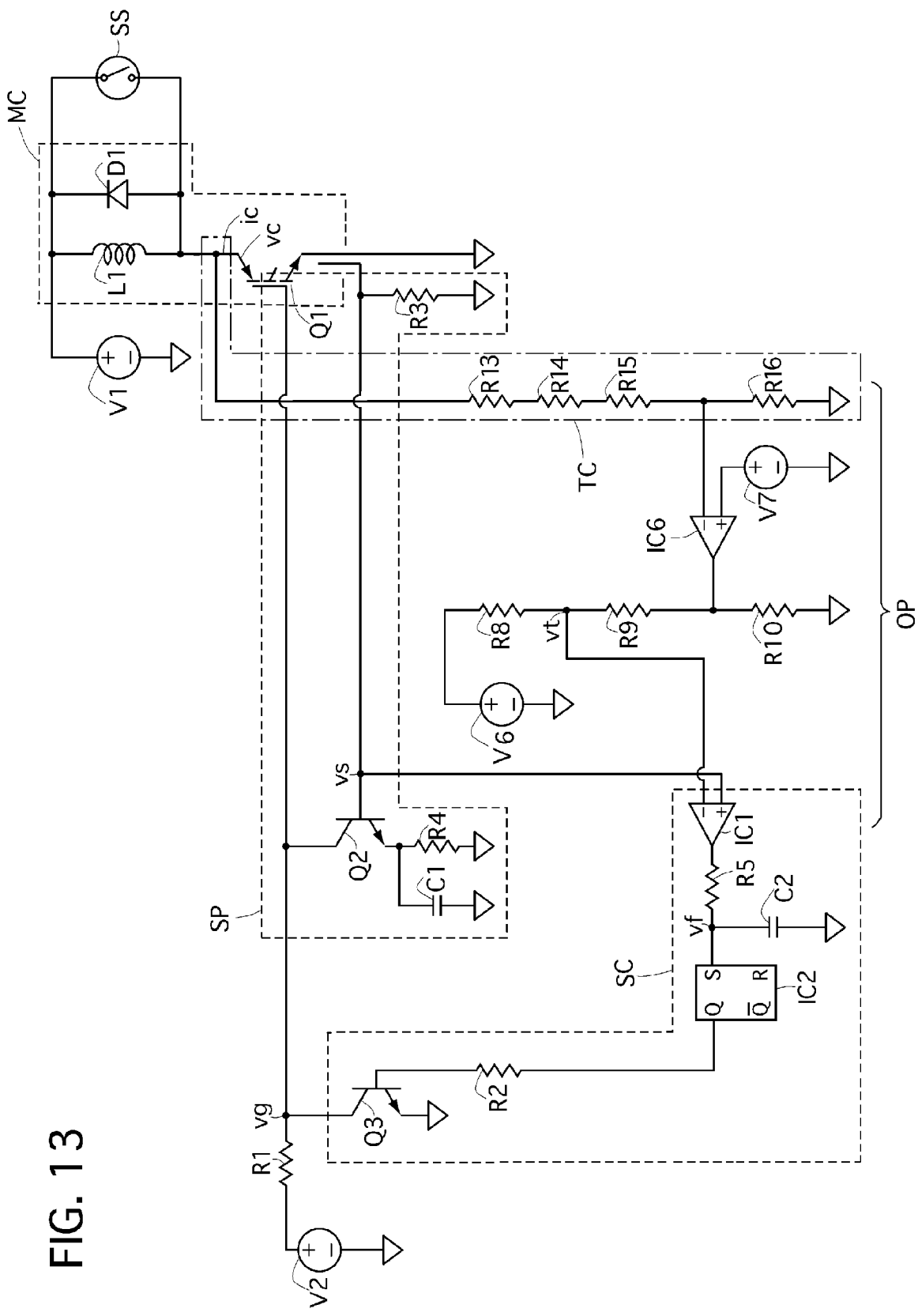
FIG. 13 is a view showing a circuit construction of a semiconductor switching element drive circuit according to a fifth embodiment of the invention.

As shown in FIG. 13, the semiconductor switching element drive circuit of the fifth embodiment is different from the third embodiment in the over current threshold value voltage setting circuit TC.

That is, in the semiconductor switching element drive circuit of the fifth embodiment, a non-reverse input terminal of a fifth comparator IC6 is connected to a power supply V7, and a reverse input terminal thereof is connected to an intermediate portion between resistances R13, R14, and R15, which are arranged in these order between the collector terminal of the IGBT Q1 and the ground, and a resistance R16. The other construction is similar to that of the third embodiment.

Figure 14:
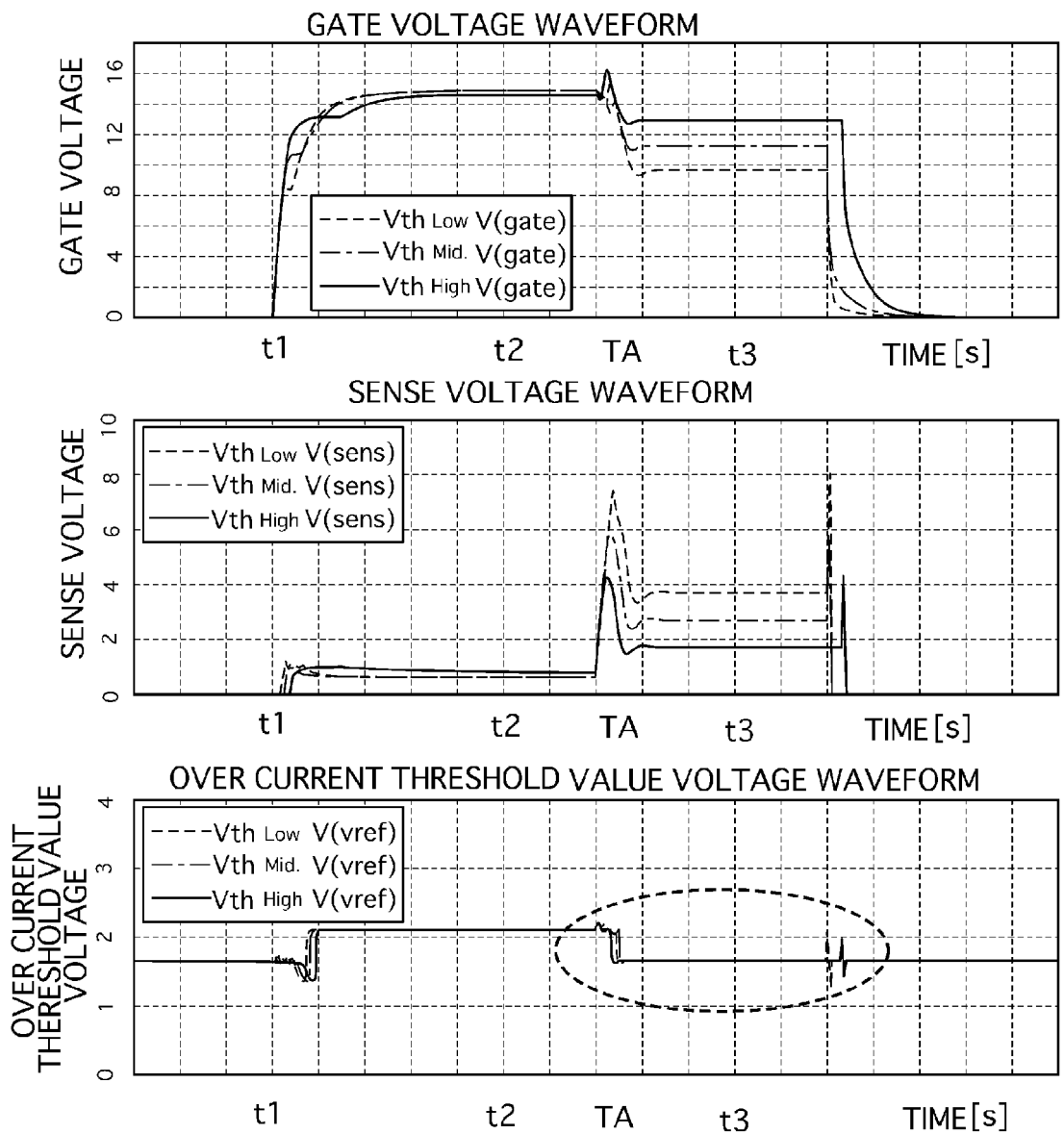
FIG. 14 is a view showing a time chart of an example of operating characteristics of gate voltage, sense voltage, and over current threshold value voltage before and after the occurrence of short circuit in the semiconductor switching element drive circuit of the fifth embodiment.
Figure 15:
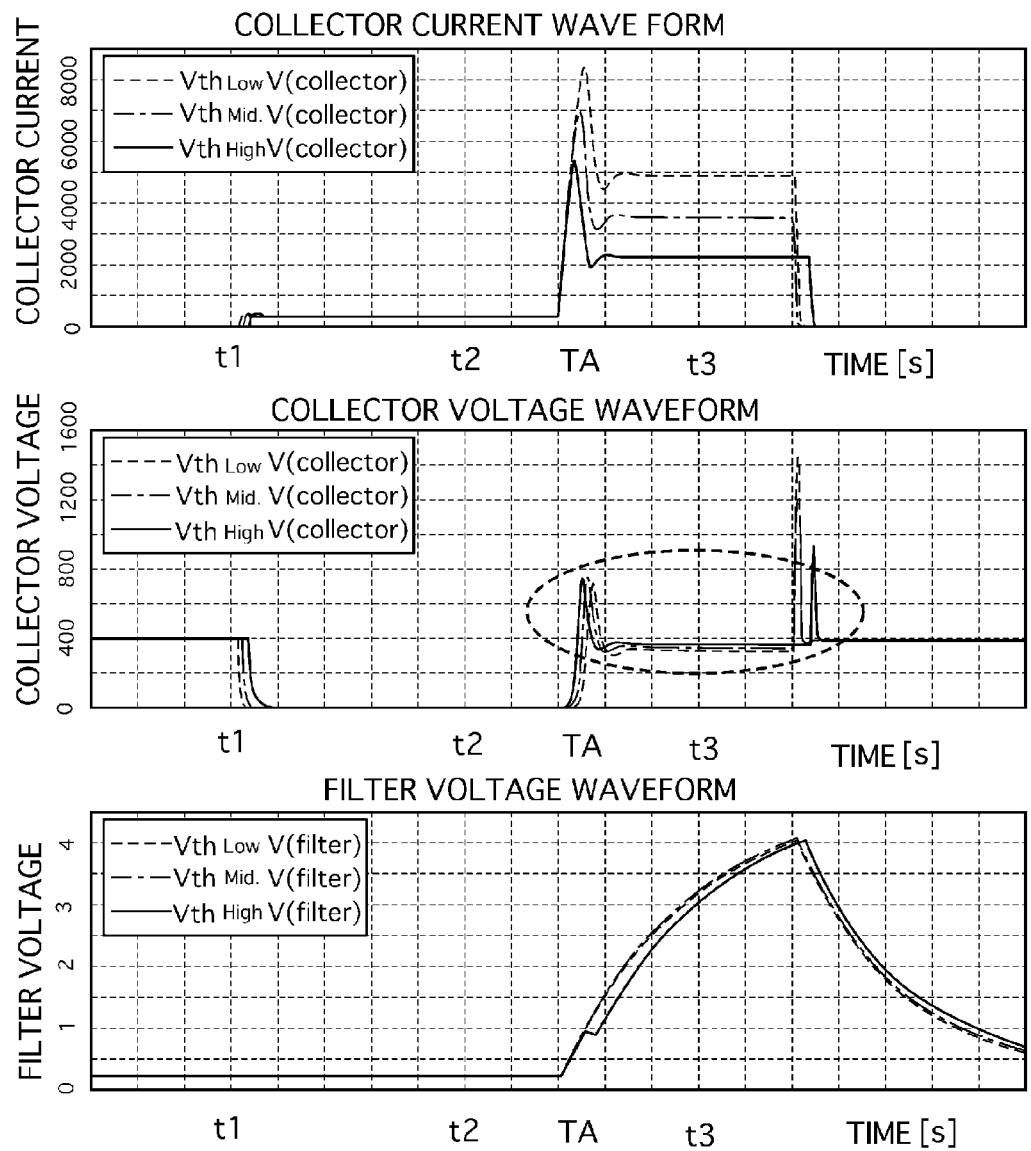
FIG. 15 is a view showing a time chart of an example of operating characteristics of collector current, collector voltage, and filter voltage before and after the occurrence of short circuit in the semiconductor switching element drive circuit of the fifth embodiment.

Incidentally, FIGS. 14 and 15 correspond to FIGS. 2 and 3 of the first embodiment, respectively. The upper and middle time chart in FIG. 14 and all of the time charts in FIG. 15 are similar to the corresponding time charts in FIGS. 2 and 3 of the first embodiment. The lower time chart is different from that of the first embodiment.

When the IGBTG Q1 is in a state of short circuit, high short current runs, and the collector voltage is high, that is, in an action state of, what is called, an activated range.

Accordingly, in the fifth embodiment, the fifth comparator IC6 compares the collector side voltage obtained by volt-dividing the detected collector voltage vc by using the resistances R13, R13, R14 and the resistance R16 to the voltage of the power supply V7. When the collector side voltage is higher than the voltage of the power supply V7, the Low signal is inputted, while the High signal is outputted when the collector side voltage is lower than the voltage of the power supply V7. After then, the judgment about the over current is carried out similarly to in a case of the third embodiment.

Therefore, the semiconductor switching element drive circuit of the fifth embodiment can provide the effect similar to those of the third embodiment.

Further, although the gate voltage vg varying due to the characteristics of the semiconductor is monitored in the fifth embodiment, the collector voltage, which has a small variation due to the characteristics of the semiconductor switching element is monitored in the fifth embodiment.

Therefore, it can be judged in higher accuracy whether the short circuit protection circuit acts or not.

Sixth Embodiment

Next, a semiconductor switching element drive circuit of a sixth embodiment according to the present invention will be described with reference to FIG. 16.

Figure 16:
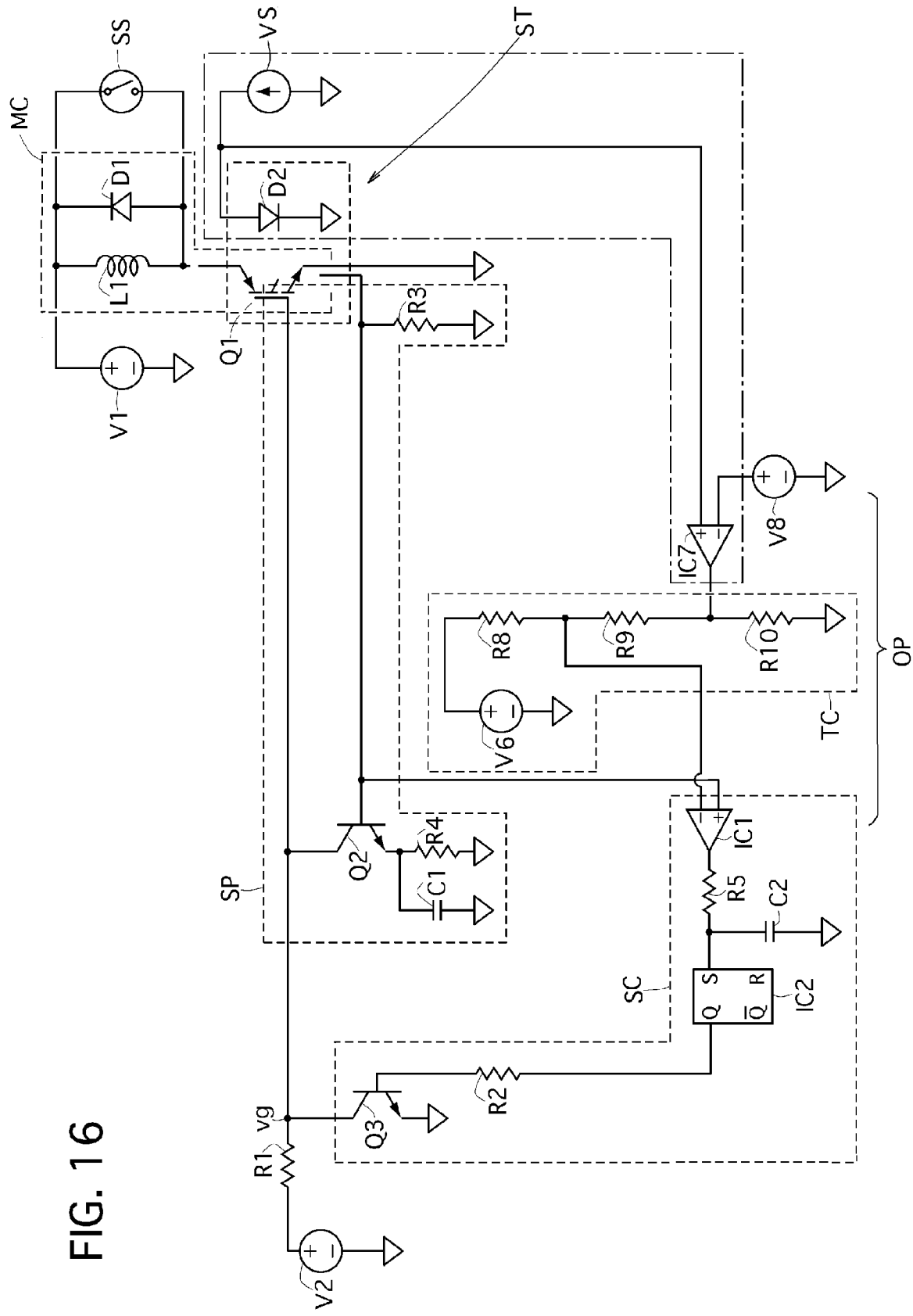
FIG. 16 is a view showing a circuit construction of a semiconductor switching element drive circuit according to a sixth embodiment of the invention.

As shown in FIG. 16, the semiconductor switching element drive circuit of the sixth embodiment is different from the third embodiment in the over current threshold value voltage setting circuit TC.

That is, in the semiconductor switching element drive circuit of the sixth embodiment, there is provided on the IGBT Q1 with an on-chip temperature sensor ST (corresponding to a temperature detecting means) that detects a temperature of the IGBT Q1. The on-chip temperature sensor ST includes a diode D2 arranged near the IGBT Q1, where a cathode thereof is grounded, an anode thereof is connected to a power supply VS.

An intermediate portion between the anode and the power supply VS is connected to a non-reverse input terminal of a sixth comparator IC7, and a reverse input terminal thereof is connected to a power supply V8. The other construction is similar to that of the third embodiment.

When the temperature of the IGBT Q1 rises due to the short circuit, the current that passes to the ground through the diode D2 at a high temperature increases, and the voltage imposed to the non-reverse input terminal of the sixth comparator IC7 decreases. Consequently, when the voltage at the intermediate portion becomes lower than the voltage of the power supply V8, and the sixth comparator IC7 outputs the Low signal to prevent a large fall of the over current threshold value voltage vt.

Therefore, the semiconductor switching element drive circuit of the sixth embodiment can provide the effects similar to those of the third embodiment.

In addition, it can provide the effect in that a temperature sensor that is been usually used in a system can double as the temperature sensor used in this embodiment.

Seventh Embodiment

Figure 18:
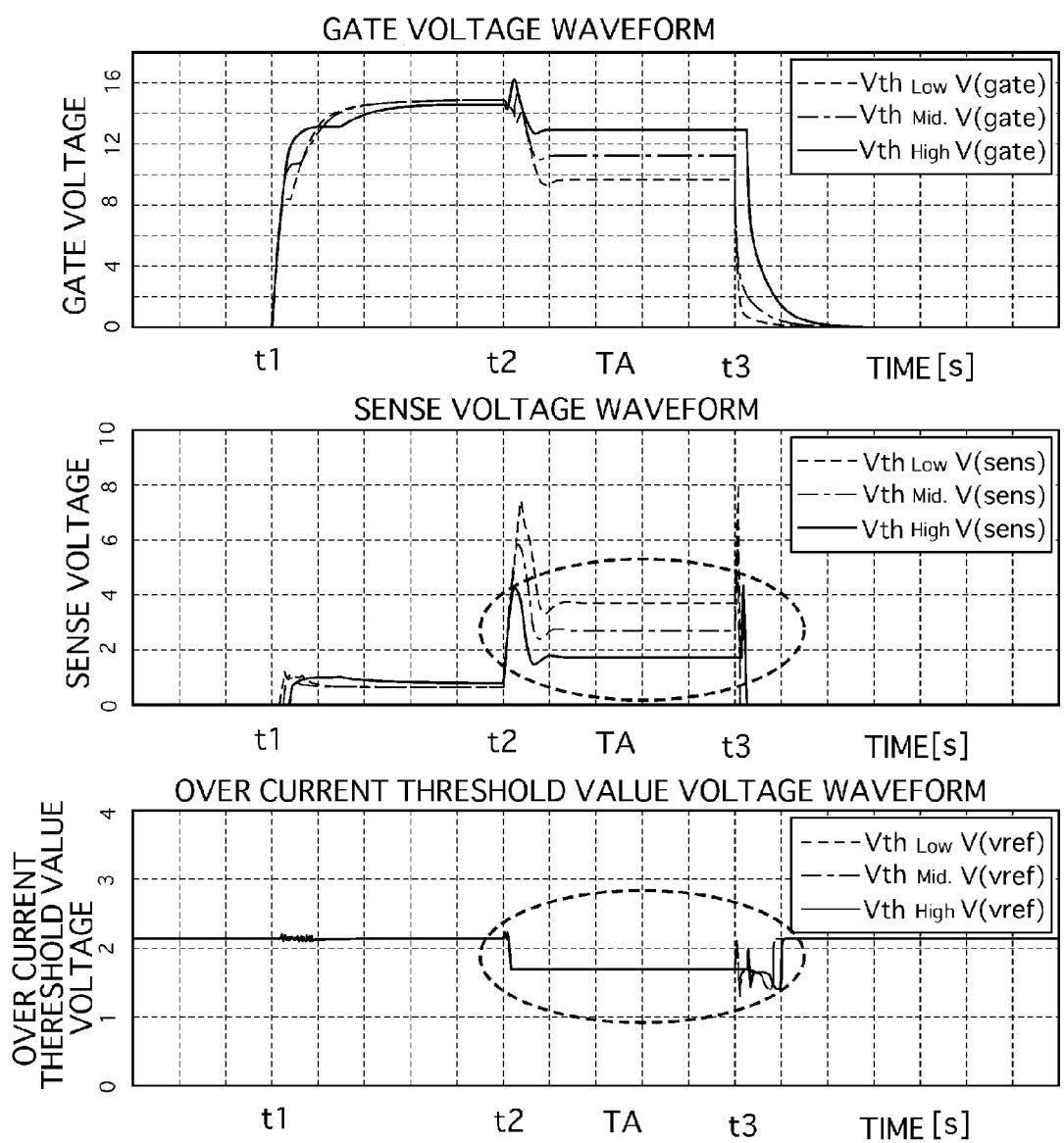
FIG. 18 is a view showing a time chart of an example of operating characteristics of gate voltage, sense voltage, and over current threshold value voltage before and after the occurrence of short circuit in the semiconductor switching element drive circuit of the seventh embodiment.
Figure 19:
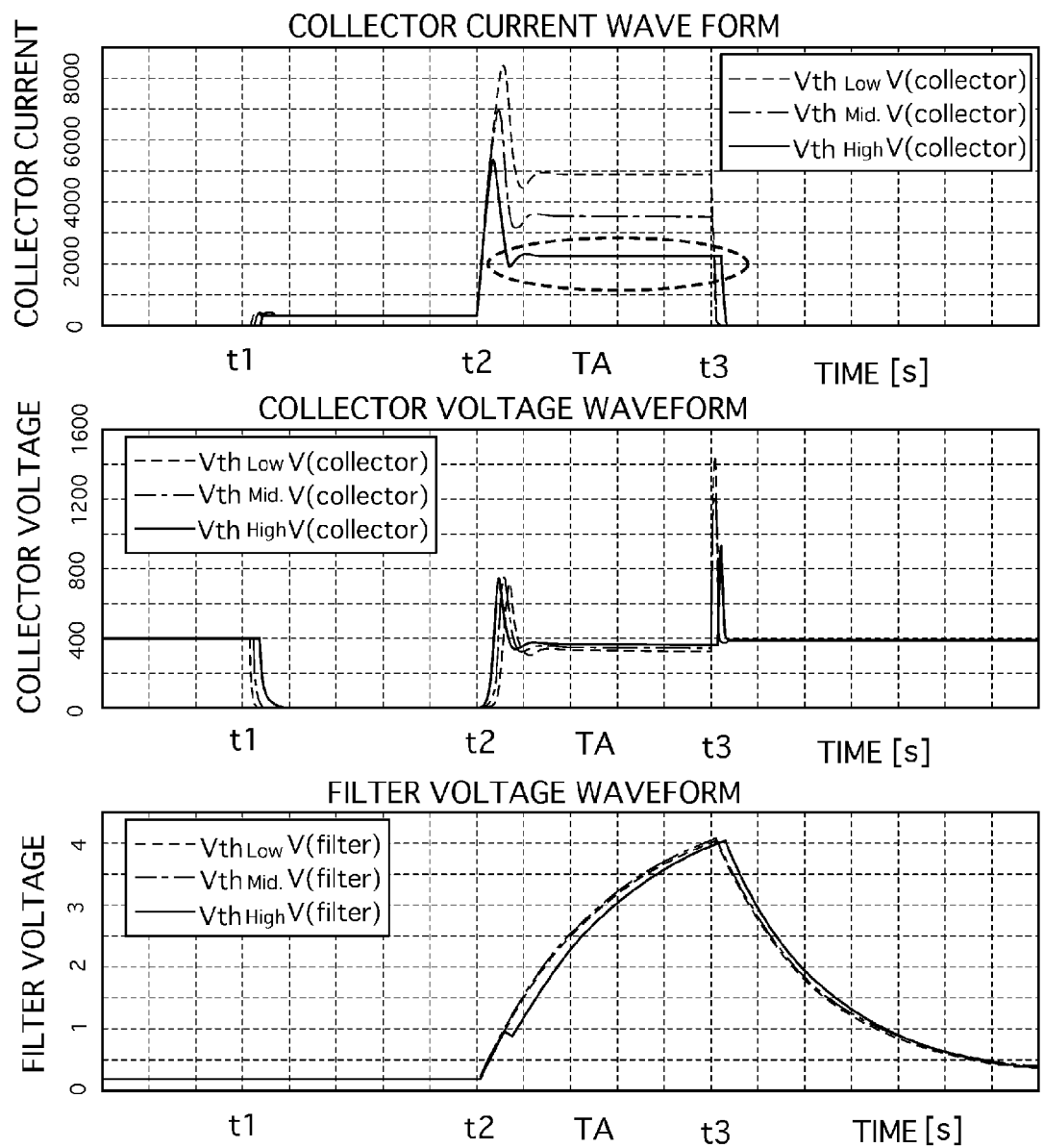
FIG. 19 is a view showing a time chart of an example of operating characteristics of collector current, collector voltage, and filter voltage before and after the occurrence of short circuit in the semiconductor switching element drive circuit of the seventh embodiment.

Next, a semiconductor switching element drive circuit of a seventh embodiment according to the present invention will be described with reference to FIGS. 17 to 19.

Figure 17:
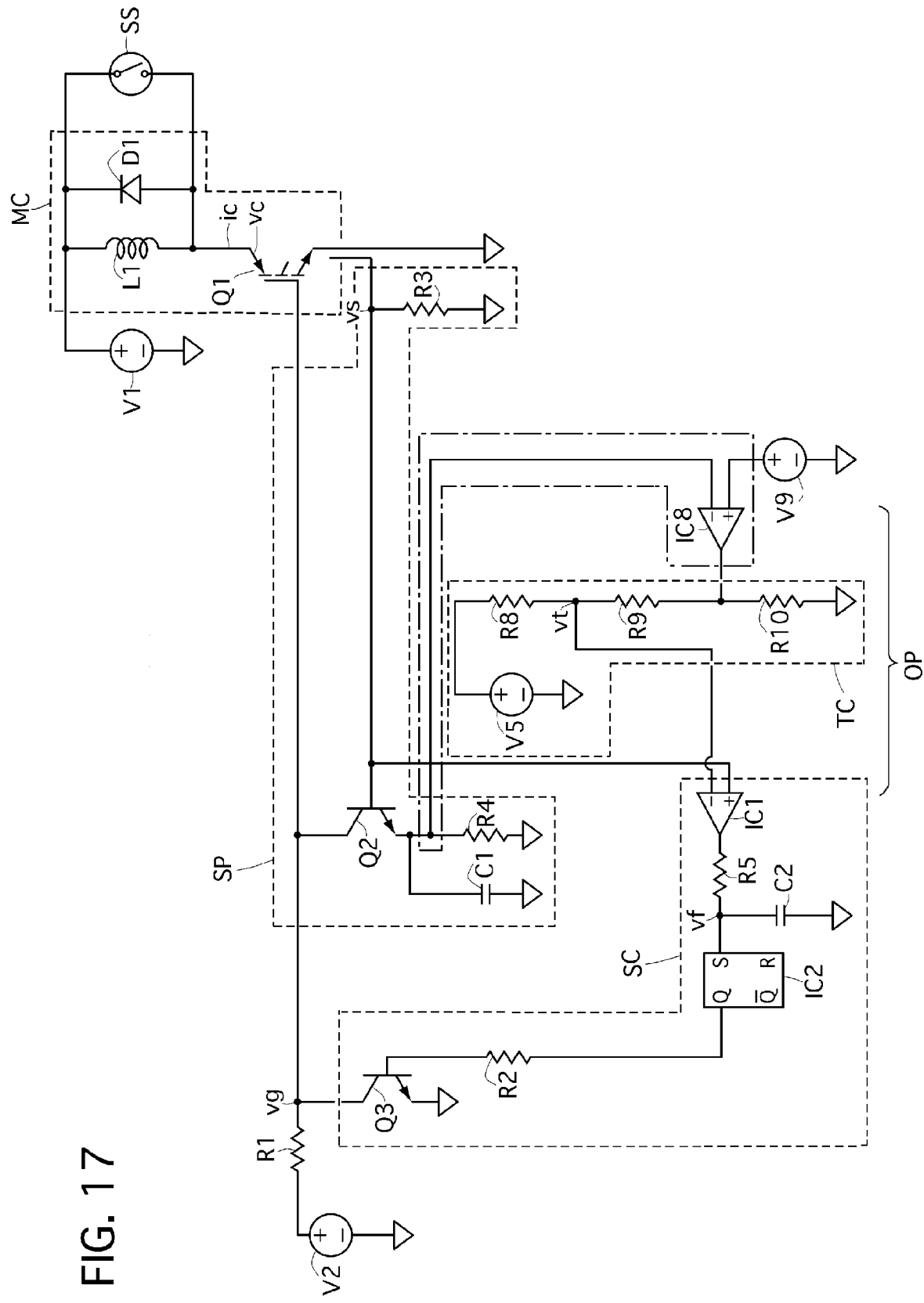
FIG. 17 is a view showing a circuit construction of a semiconductor switching element drive circuit according to a seventh embodiment of the invention.

As shown in FIG. 17, the semiconductor switching element drive circuit of the seventh embodiment is different from the third embodiment in that some of resistances used in the over current threshold level voltage setting circuit TC are removed and the short circuit protection circuit decreases the over current threshold value voltage.

That is, a reverse input terminal of a seventh comparator IC8 is connected to an intermediate portion between the emitter of the over current restricting transistor Q2 and the resistance R4, and a non-reverse input terminal thereof is connected to a power supply V9. An output terminal thereof is connected to an intermediate portion between a resistance R9 and a resistance R20. The other construction of the seventh embodiment is similar to that of the third embodiment.

The gate voltage interrupting transistor Q2 becomes ON at the short circuit, which causes the current to pass the resistance R4 to rise the potential between the emitter of the gate voltage interrupting transistor Q2 and the resistance R4.

Then, the seventh comparator IC8 outputs the Low signal to suppress the fall of the over current threshold value voltage vt similarly to in the third embodiment.

Therefore, the semiconductor switching element drive circuit of the seventh embodiment can proved the effects similar to those of the third embodiment.

Although the invention has been explained based on the embodiments, the invention is not limited to these embodiments. The design changes and the like are contained in the invention as long as they do not depart from the scope of the invention.

For example, the load to which the semiconductor is connected employs an electric motor in the embodiments, while it is not limited to the motor.

In addition, the transistors and the IGBTs can employ other type ones. Further, the SR flip-flop may employ a latch circuit, and it is not limited to a flip-flop.

The invention claimed is:

1. A semiconductor switching element drive circuit comprising:
    a semiconductor that passes main current between a first terminal and a second terminal thereof when voltage is imposed to a gate terminal thereof;
    an over current protection circuit that judges that the main current is judged to become over current exceeding a predetermined current value for a certain period when one of current value and voltage value proportional to an amplitude of the main current exceeds a threshold value, and then the over current protection circuit decreasing the main current;
    a short circuit protection circuit that decreases the gate voltage imposed to the gate terminal earlier than a fall of the main current produced by the over current protection circuit; and
    a threshold value change circuit that decreases the threshold value when the short circuit protection circuit is activated to decrease the main current,
    wherein the threshold value change circuit includes:
        a plurality of resistances that divide the gate voltage to obtain the over current threshold value voltage; and
        a first comparator that compares the over current threshold value voltage to sense voltage proportional to the main current to output an output signal for activating the over current protection circuit when the sense voltage exceeds the threshold value voltage and for prohibiting an action of the over current protection circuit when the sense voltage is lower than the over current threshold value voltage.

2. The semiconductor switching element drive circuit according to claim 1, wherein the threshold value change circuit includes:
    a second comparator that constitutes a collector open output type OR circuit with the first comparator; and
    a power supply that imposes a predetermined voltage to output terminals of the first and second comparators.

3. The semiconductor switching element drive circuit according to claim 1, wherein the threshold value change circuit includes:
    a second comparator that outputs an output value different according to an amplitude of the gate voltage; and
    a plurality of resistances that change supplied voltage according to the output value of the second comparator.

4. The semiconductor switching element drive circuit according to claim 1, further comprising:
    a gate resistance that decreases the gate voltage imposed to the gate terminal,
    wherein the threshold value change circuit includes:
        a second comparator that outputs an output value different according to an amplitude of both ends of the gate resistance; and
        a plurality of resistances that change supplied voltage into divided voltage according to an output of the second comparator.

5. The semiconductor switching element drive circuit according to claim 1, wherein the threshold value change circuit includes:
    a second comparator that outputs an output value different according to an amplitude of voltage at a load side terminal of the first terminal and the second terminal of the semiconductor; and
    a plurality of resistances that change supplied voltage into divided voltage according to an output of the second comparator.

6. The semiconductor switching element drive circuit according to claim 1, further comprising:
    a temperature detecting means that detects a temperature of the semiconductor,
    wherein the threshold value change circuit includes:
        a second comparator that outputs an output value different according to an amplitude of the temperature detected by the temperature detecting means; and
        a plural of resistances that change supplied voltage into divided voltage according to the second comparator.

7. The semiconductor switching element drive circuit according to claim 1, further comprising:
    a short circuit protecting semiconductor that turns ON at short circuit of the short circuit protection circuit to decrease the gate voltage of the semiconductor switching element through a short circuit protecting resistance;
    a second comparator that outputs an output value different according to an amplitude of a potential between the short circuit protecting resistance; and
    a plurality of resistances that change supplied voltage into divide voltage according to the output value of the second comparator.

8. The semiconductor switching element drive circuit according to claim 2, wherein the threshold value change circuit includes:
    a third comparator that outputs an output value different according to an amplitude of the gate voltage; and
    a plurality of resistances that change supplied voltage according to the output value of the third comparator.

9. The semiconductor switching element drive circuit according to claim 2, further comprising:
    a gate resistance that decreases the gate voltage imposed to the gate terminal,
    wherein the threshold value change circuit includes:
        a third comparator that outputs an output value different according to an amplitude of both ends of the gate resistance; and
        a plurality of resistances that change supplied voltage into divided voltage according to an output of the third comparator.

10. The semiconductor switching element drive circuit according to claim 2, wherein the threshold value change circuit includes:
    a third comparator that outputs an output value different according to an amplitude of voltage at a load side terminal of the first terminal and the second terminal of the semiconductors; and
    a plurality of resistances that change supplied voltage into divided voltage according to an output of the third comparator.

11. The semiconductor switching element drive circuit according to claim 2, further comprising:
- a temperature detecting means that detects a temperature of the semiconductor,
- wherein the threshold value change circuit includes:
  - a thirds comparator that outputs an output value different according to an amplitude of the temperature detected by the temperature detecting means; and
  - a plural of resistances that change supplied voltage into divided voltage according to the third comparator.

12. The semiconductor switching element drive circuit according to claim 2, further comprising:
- a short circuit protecting semiconductor that turns ON at short circuit of the short circuit protection circuit to decrease the gate voltage of the semiconductor switching element through a short circuit protecting resistance,
- a third comparator that outputs an output value different according to an amplitude of a potential between the short circuit protecting resistance; and
- a plurality of resistances that change supplied voltage into divide voltage according to the output value of the third comparator.

\* \* \* \* \*